United States Patent
Kozuka et al.

(10) Patent No.: US 6,822,289 B2
(45) Date of Patent: Nov. 23, 2004

(54) SEMICONDUCTOR DEVICE AND LIQUID JET APPARATUS USING THE SAME

(75) Inventors: Hiraku Kozuka, Kanagawa (JP); Osamu Iketa, Kanagawa (JP); Mineo Shimotsusa, Tokyo (JP); Takashi Morii, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 2 days.

(21) Appl. No.: 10/368,579

(22) Filed: Feb. 20, 2003

(65) Prior Publication Data

US 2003/0155585 A1 Aug. 21, 2003

(30) Foreign Application Priority Data

Feb. 20, 2002 (JP) ........................................ 2002-043164
Feb. 10, 2003 (JP) ........................................ 2003-032345

(51) Int. Cl.[7] ............................................. H01L 29/76
(52) U.S. Cl. ........................................ 257/335; 257/370
(58) Field of Search ................................. 257/370, 335, 257/328–329, 332

(56) References Cited

U.S. PATENT DOCUMENTS 5,917,222 A * 6/1999 Smayling et al. ........... 257/370
6,302,504 B1 10/2001 Imanaka et al. ................ 347/9
2002/0125511 A1 * 9/2002 Shimotsusa ................. 257/288

FOREIGN PATENT DOCUMENTS

EP 0 816 082 A2 1/1998
JP 10-34898 2/1998

* cited by examiner

*Primary Examiner*—Dung A. Le
(74) *Attorney, Agent, or Firm*—Fitzpatrick, Cella Harper & Scinto

(57) ABSTRACT

A semiconductor device having a high source breakdown voltage and high performance and high reliability and a liquid jet apparatus are provided. In a semiconductor device having a switching element for flowing current through a load and a circuit for driving the switching element, respectively formed on the same substrate, the circuit has a source follower transistor for generating a drive voltage to be applied to a control electrode of the switching element, and the source region of the source follower transistor has a first doped region connected to the source electrode and a second doped region having an impurity concentration lower than that of the first doped region, the second doped region forming a pn junction with a semiconductor region forming a channel.

18 Claims, 26 Drawing Sheets

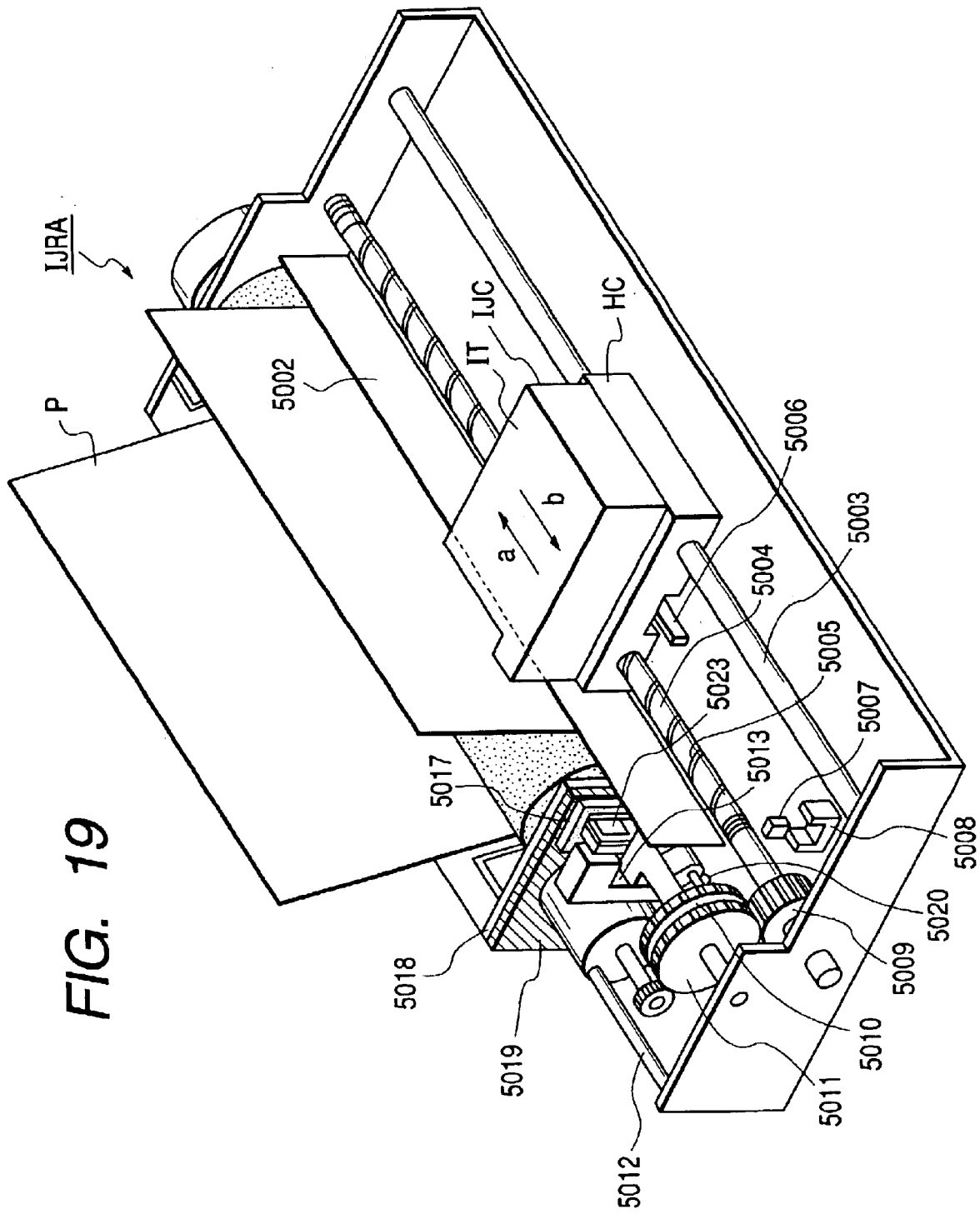

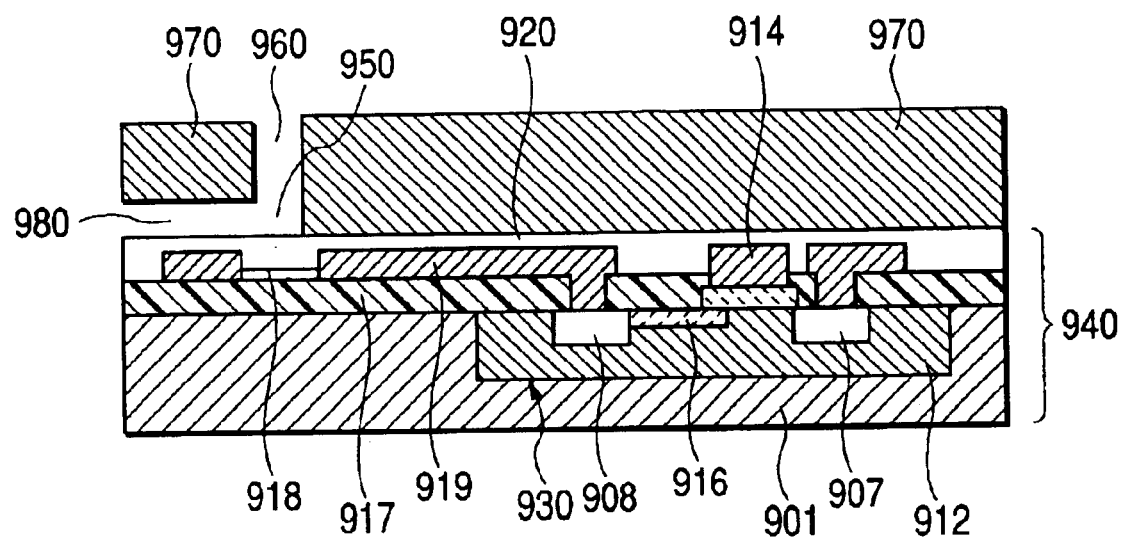
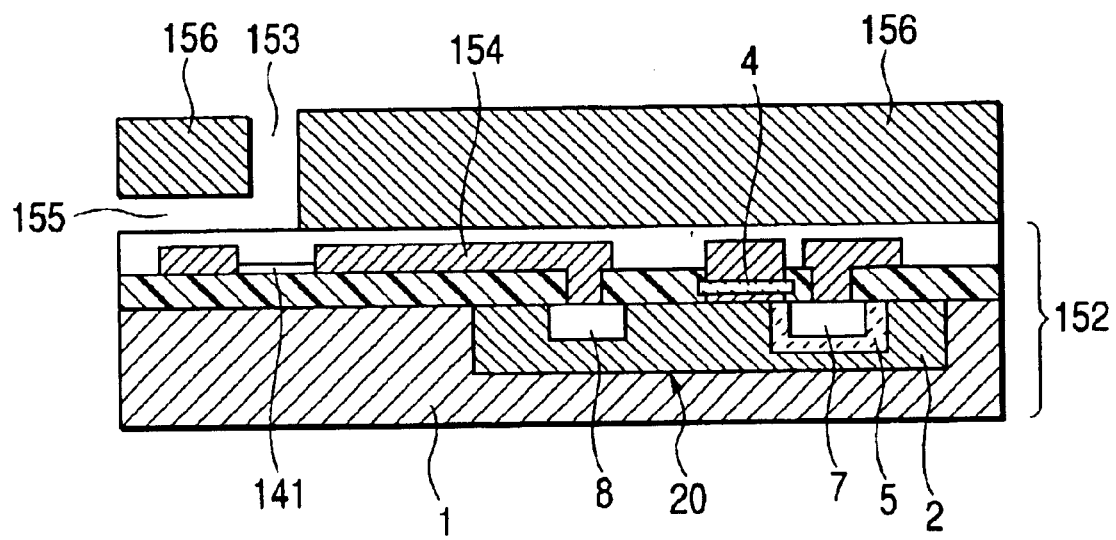

SEMICONDUCTOR DEVICE AND LIQUID JET APPARATUS USING THE SAME

BACKGROUND OF THE INVENTION

1. Field of the Invention

The present invention generally relates to semiconductor devices having transistors such as those called insulated gate type transistors, metal insulator semiconductor (MIS) type field effect transistors and MOS transistors. The present invention specifically relates to a semiconductor device suitable for being mounted on a liquid jet apparatus such as an ink jet apparatus, a DNA chip and an organic transistor and also relates to a liquid jet apparatus using such a semiconductor device. The liquid jet apparatus is used as an output terminal of a copying machine, a facsimile, a word processor, a computer and the like.

2. Related Background Art

An example of a semiconductor device used with a liquid jet apparatus will be described.

A semiconductor device for a liquid jet head has electrothermal conversion elements, switching elements for switching the electrothermal conversion elements, and a circuit for driving the switching elements, all being fabricated on the same substrate.

FIG. 20 is a schematic cross sectional view showing a portion of a liquid jet head having a conventional structure.

Reference numeral 901 represents a semiconductor substrate made of single crystal silicon. Reference numeral 912 represents a p-type well region, 908 represents an n-type drain region having a high impurity concentration, 916 represents an n-type drain region having a low impurity concentration, 907 represents an n-type source region having a high impurity concentration, and 914 represents a gate electrode, these elements constituting a switching element 930 made of a MIS type field effect transistor. Reference numeral 917 represents a silicon oxide layer serving as a heat accumulation layer and an insulating layer, 918 represents a tantalum nitride film serving as a heat generating resistor layer, 919 represents an aluminum alloy layer serving as a wiring layer, and 920 represents a silicon nitride layer serving as a protective layer, these elements constituting a main base 940 for a recording head. An area 950 is a heat generating area, and ink is jetted out of a jet port 960. A top plate 970 together with the main base 940 defines a liquid path 980.

Large current is required to drive a large load such as an electrothermal conversion element. If a conventional MIS type field effect transistor 930 is used for driving the electrothermal conversion element, the pn junction between the drain and well region cannot resist a high electric field generated by a reverse bias. Leak current is therefore generated and the breakdown voltage necessary for a switching element is hard to be satisfied. In addition, if an on-resistance of the MIS type field effect transistor used as the switching element is large, current is wastefully used so that current necessary for driving the electrothermal conversion element becomes hard to be obtained.

In order to solve the problem of the breakdown voltage of the switching element, a double diffusion metal oxide semiconductor (DMOS) 20 shown in FIG. 21 may be used.

In FIG. 21, reference numeral 152 represents a main base on which an electrothermal conversion element 141 serving as a load, a DMOS transistor 20 and a MOS transistor (not shown) are integrated. Reference numeral 153 represents a jet port, 154 represents a wiring electrode, 155 represents a liquid path, and 156 represents a top plate.

The structure of the DMOS transistor 20 is different from that of a general MOS transistor. A channel is formed later in the drain so that the drain can be made deep and its impurity concentration can be made low. The problem of the drain breakdown voltage can therefore be solved.

Although the DMOS transistor 20 has the characteristics sufficient for a high breakdown switching element, it is not versatile.

The reason for this will be specifically described with reference to FIG. 22. FIG. 22 is a circuit diagram of a circuit which has a load and a switching element and flows current through the load by controlling the operation of the switching element.

With the circuit arrangement shown in FIG. 22, if the power supply voltage VDD is set to 5.0 V or 3.3 V, a high level voltage signal output from an AND gate 46 is VDD. This signal is applied to a CMOS circuit 52 such as a CMOS inverter and input to the gate control electrode of the switching element 41.

An important point is the value of a voltage VHT applied to the CMOS circuit 52. The voltage VHT determines a voltage to be applied to the gate of the switching element 41. The value of VHT is required to be designed so that the on-resistance of the switching element 41 becomes lowest. If the on-resistance is made lowest, the size of a MOS transistor constituting the switching element, i.e., the area of an integrated circuit chip occupied by the MOS transistor, can be made smallest.

If this voltage is to be generated in the one chip integration circuit including the circuit shown in FIG. 22, it is necessary to change the voltage level from the power supply voltage VH to the voltage VHT in the integration circuit.

A transistor source follower circuit is used as the circuit for changing the voltage level, i.e., as a level shift circuit. The constant voltage VHT may be obtained by using the transistor source follower circuit (refer to Japanese Patent Application Laid-Open No. 10-034898, U.S. Pat. No. 6,302, 504).

According to the knowing of the present inventor, no problem occurred if a sufficient drain breakdown voltage of a source follower transistor of the level shift circuit is obtained under the conditions of a highest power supply voltage VH of 30 V, a lowest reference voltage VGNDH of 0 V and a middle reference voltage VHT of 12 V.

However, the source of the source follower transistor was broken down when the highest power supply voltage VH was raised to 33 V, the lowest reference voltage VGNDH was set to 0 V and the middle reference voltage VHT was raised to 15 V, because of the reverse bias voltage of 15 V applied across the pn junction between the source and well regions of the source follower transistor.

Although attention is generally paid to the drain breakdown voltage, according to the knowing of the present inventor, attention is also required to be paid to the source breakdown voltage if the circuit shown in FIG. 22 is used at high power supply voltages.

An object of the invention is to provide a semiconductor device having a high source breakdown voltage, high performance and high reliability, and a liquid jet apparatus using such a semiconductor device.

Another object of the invention is to provide a semiconductor device capable of stably flowing large current through a load and capable of high integration, and a liquid jet apparatus using such a semiconductor device.

SUMMARY OF THE INVENTION

According to a main aspect of the invention, there is provided a semiconductor device having a switching element for flowing current through a load and a circuit for driving the switching element, respectively formed on a same substrate, wherein: the circuit comprises a source follower transistor for generating a drive voltage to be applied to a control electrode of the switching element; and a source region of the source follower transistor comprises: a first doped region connected to a source electrode; and a second doped region having an impurity concentration lower than an impurity concentration of the first doped region, the second doped region forming a pn junction with a semiconductor region forming a channel.

In the semiconductor device of the invention, it is preferable that the switching element is a DMOS transistor, the DMOS transistor comprising: a low impurity concentration drain region made of semiconductor of a second conductivity type and formed in a principal surface of a semiconductor substrate of a first conductivity type; a semiconductor region of the first conductivity type formed in the low impurity concentration drain region; a gate electrode as the control electrode formed via an insulating film on a surface where the pn junction between the semiconductor region and the low impurity concentration drain region; a source region of the second conductivity type formed on one end side of the gate electrode; and a drain region of the second conductivity type formed in the low impurity concentration drain region and having an impurity concentration higher than an impurity concentration of the low impurity concentration drain region; and the source follower transistor is an insulated gate type transistor having characteristics different from the DMOS transistor.

It is preferable that the drain of the source follower transistor comprises a first doped region connected to a drain electrode and a second doped region having an impurity concentration lower than an impurity concentration of the first doped region, the second doped region forming a pn junction with the semiconductor region forming the channel.

It is preferable that the drive voltage generated by the source follower transistor is applied to the control electrode via a CMOS circuit.

It is preferable that the second doped region of the source follower transistor is shallower than a depth of the low impurity concentration drain region.

It is also preferable that the second doped region of the source follower transistor has a depth same as a depth of the low impurity concentration drain region.

In the invention, it is preferable that the semiconductor region is formed deeper than the low impurity concentration drain region.

A plurality of DMOS transistors is disposed in an array without involving a dedicated element separation region.

It is preferable that the circuit comprises a low voltage CMOS circuit and a high voltage CMOS circuit to be controlled by the low voltage CMOS circuit, and a MOS transistor of the first conductivity type constituting the high voltage CMOS circuit is a DMOS transistor.

It is also preferable that a MOS transistor of the second conductivity type constituting the high voltage CMOS circuit comprises a low impurity concentration drain region and a high impurity concentration drain region having an impurity concentration higher than an impurity concentration of the first low impurity concentration region, respectively formed in a well region of the second conductivity type.

In the invention, it is preferable that the circuit comprises: a low voltage CMOS circuit; a high voltage CMOS circuit to be controlled by the low voltage CMOS circuit, the high voltage CMOS circuit applying the drive voltage to the control electrode of the switching element; and a voltage converting circuit for receiving a low voltage signal from the low voltage CMOS circuit and outputting a high voltage signal to the high voltage CMOS circuit.

It is preferable that the voltage converting circuit comprises a CMOS inverter and a MOS switch, the MOS switch being connected to a source of one MOS transistor constituting the CMOS inverter and turned on and off synchronously with the one MOS transistor.

Alternatively, the voltage converting circuit may include a CMOS inverter having a MOS transistor of one conductivity type with a plurality of gate electrodes to which a same phase signal is applied.

In the invention, an electrothermal conversion body serving as the load is integrated with and connected to a drain of the switching element.

The characteristics are at least one selected from a group consisting of a threshold value, a breakdown voltage, and a substrate current.

According to another aspect of the present invention, there is provided a liquid jet apparatus for jetting out liquid by utilizing heat generated by an electrothermal conversion body, comprising: a semiconductor device described above; and a jet port provided in correspondence with the electrothermal conversion body serving as the load.

The liquid jet apparatus further comprises a container for accommodating liquid to be supplied to the electrothermal conversion body.

According to still another aspect of the invention, there is provided a liquid jet apparatus for jetting out liquid by utilizing heat generated by an electrothermal conversion body, comprising: a semiconductor device described above; a jet port provided in correspondence with the electrothermal conversion body serving as the load; a container for accommodating liquid to be supplied to the electrothermal conversion body; and a power supply circuit for supplying a power supply voltage to the semiconductor device.

Other features and advantages of the present invention will become apparent from the following description taken in conjunction with the accompanying drawings.

BRIEF DESCRIPTION OF THE DRAWINGS

FIG. 19 is a diagram showing a liquid jet apparatus according to an embodiment of the invention.

FIG. 20 is a schematic cross sectional view of a conventional recording head.

FIG. 21 is a schematic cross sectional view of a recording head.

DETAILED DESCRIPTION OF THE PREFERRED EMBODIMENTS

Embodiments of the invention will be described with reference to the accompanying drawings.

Figure 1A:
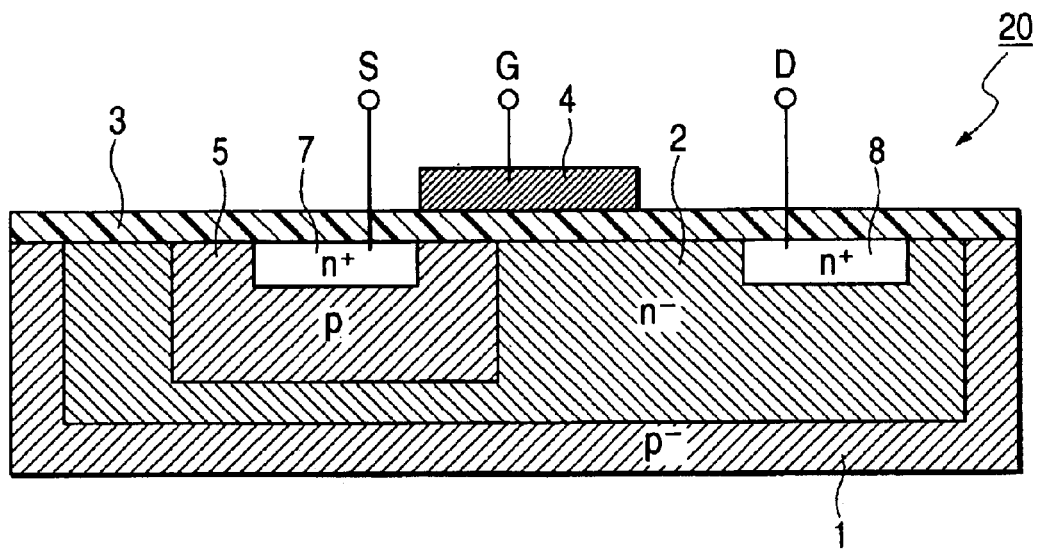
FIG. 1A is a cross sectional view of a switching element used by the present invention.
Figure 1B:
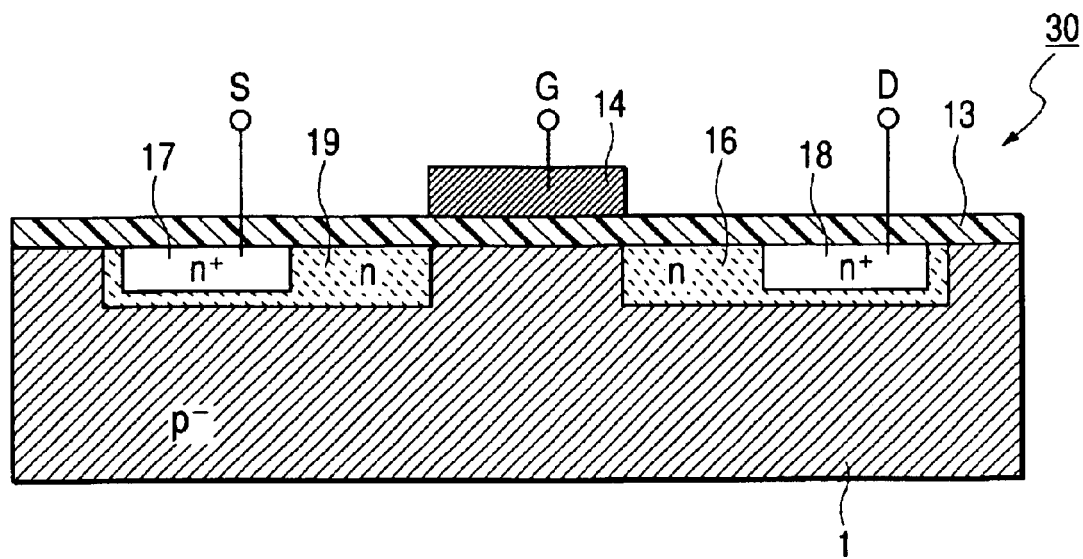
FIG. 1B is a cross sectional view of a drive circuit element used by the present invention.

FIGS. 1A and 1B are cross sectional views of a switching element and a circuit for driving the switching element according to the invention.

In the following description, although a double diffused metal oxide semiconductor (DMOS) transistor is used as the switching element, the invention is not limited only thereto.

In FIG. 1A, reference numeral 1 represents a semiconductor substrate of a first conductivity type (e.g., p-type), 2 represents a well region of a second conductivity type (e.g., n-type), 3 represents a gate insulating film, 4 represents a gate electrode, 5 represents a semiconductor region (base region) of the first conductivity type, 7 represents a source region of the second conductivity type connected to a source electrode, and 8 represents a drain region of the second conductivity type having a high impurity concentration and connected to a drain electrode. The pn junction between the well region 2 and base region 5 is terminated at the upper surface of the semiconductor substrate. The upper surface is covered with the gate insulating film 3 on which the gate electrode 4 is disposed.

These regions constitute a DMOS transistor 20.

In the DMOS transistor 20 serving as a switching element, the base region 5 is formed in the well region 2 formed sufficiently deep. The well region 2 and base region 5 function respectively as the drain and channel of the insulated gate type field effect transistor. This structure is different from the general structure. Namely, this structure is not the structure that the drain region is formed by implanting impurity ions into the region where the channel is to be formed, but the structure that the base region serving as the channel is formed by implanting impurity ions into the region where the drain region is to be formed.

The breakdown voltage of a transistor is determined by the breakdown voltage of the drain. Generally, the breakdown voltage becomes higher, the lower the impurity concentration of the drain is and the deeper the depth of the drain region is. Therefore, the rated voltages of the DMOS transistor can be set high and a large current can be flowed, realizing a high speed operation.

The effective channel length of the DMOS transistor 20 is determined by a difference of a lateral diffusion amount between the base region 5 and source region 7. Since this lateral diffusion amount is determined by physical coefficients, the effective channel length can be set relatively short so that the on-resistance can be reduced. Reduction in the on-resistance results in a large amount of current per unit size, allowing a high speed operation, energy saving and high integration.

The base region 5 and source region 7 can be formed in a self alignment manner by ion implantation using the gate electrode 4 as a mask. Therefore, the effective channel length is not subjected to a size difference by alignment so that a variation in threshold values of transistors can be suppressed.

If the base region 5 is disposed deeper than the bottom of the well region 2 so as to contact the semiconductor substrate 1, a plurality of DMOS transistors can be disposed in an array without providing a dedicated element separation region. It is therefore possible to reduce the area occupied by the DMOS transistor array. The degree of design freedom of a wiring layout for connection to a load can be improved.

FIG. 1B shows a MOS transistor 30 of the circuit for driving the switching element.

In FIG. 1B, reference numeral 1 represents a semiconductor substrate of the first conductivity type, 13 represents a gate insulating film, 14 represents a gate electrode, 16 represents a low impurity concentration drain region disposed if necessary, 17 represents a source region (first doped region) connected to a source electrode (not shown), and 18 represents a high impurity concentration drain region connected to a drain electrode (not shown) and laterally spaced apart from the gate electrode. Reference numeral 19 represents a source region (second doped region) having an impurity concentration lower than that of the source region 17 and having the conductivity type opposite to that of the semiconductor substrate.

In the MOS transistor 30, not only the drain is provided with the low impurity concentration drain region 16 having a function of relaxing an electric field but also the source is provided with the low concentration source region 19 having a function of relaxing an electric field. In addition, the high impurity concentration drain region 18 (or high impurity concentration source region 17) is spaced apart from the pn junction between the p-type semiconductor region (semiconductor substrate 1) providing the channel and the low impurity concentration drain region 16 (or low impurity concentration source region 19), and if necessary also spaced apart from the gate electrode. Accordingly, the breakdown voltages of the source and drain can be raised.

Furthermore, since the MOS transistor is not a DMOS transistor described above, the channel length can be designed as desired so that a desired threshold voltage can be set.

Although the transistors shown in FIGS. 1A and 1B have different characteristics such as threshold value, breakdown voltage and substrate current, both the transistors can be integrated on the same substrate 1 such as a silicon substrate. A large current can be flowed through the load. It is possible to raise the breakdown voltage of the switching element and suppress a substrate current. It becomes easy to design a circuit for driving the switching element.

Figure 2:
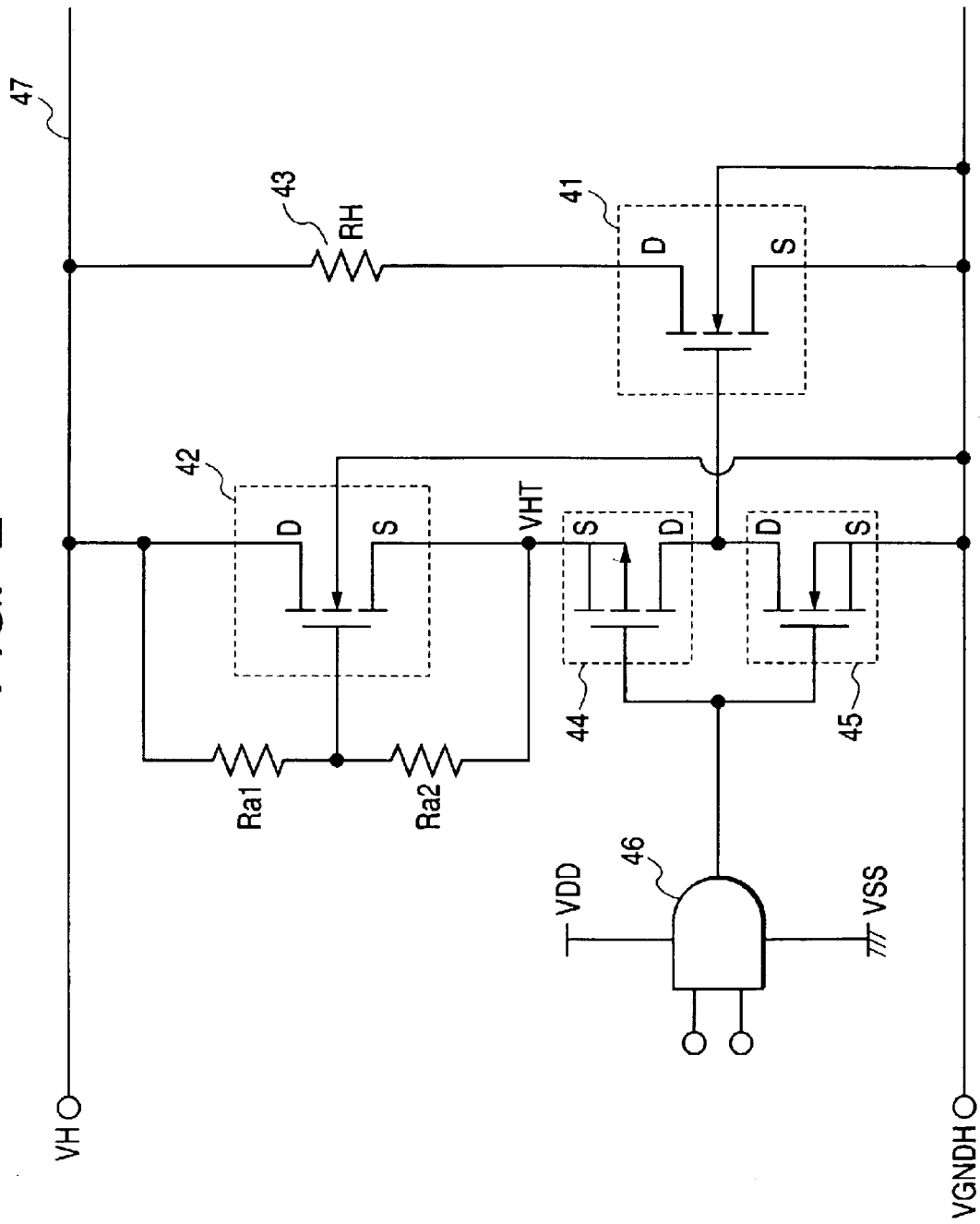
FIG. 2 is a circuit diagram of a semiconductor device according to an embodiment of the invention.

In an embodiment of the invention, for example, a circuit arrangement such as shown in FIG. 2 can be realized by using two types of transistors shown in FIGS. 1A and 1B.

In FIG. 2, reference numeral 43 represents a load such as an electrothermal conversion body. A switching element 41 made of the transistor 20 shown in FIG. 1A is connected between the load 43 and a low potential side wiring line 48 applied with a low reference voltage VGNDH.

In this embodiment, as an example of the circuit for driving the switching element 41, a circuit arrangement is adopted which has a level shift circuit, a CMOS circuit and a logic circuit.

Connected to the gate of the switching element 41 is a high voltage CMOS circuit having a pMOS transistor 44 and an nMOS transistor 45. Connected to the input terminal of the CMOS circuit is a logic circuit 46 such as an AND gate. Connected to the high potential side of the CMOS circuit is a level shift circuit for supplying a middle reference voltage VHT.

A source follower circuit 42 made of the MOS transistor 30 shown in FIG. 1B is preferably used as the level shift circuit. The level shift circuit generates the low reference voltage VHT from several V to ten and several V, from a high reference voltage VH supplied from a high potential side wiring line 47.

This reference voltage VHT can be applied to the gate of the switching element 41 via the pMOS transistor 44 of the CMOS circuit.

The high voltage CMOS circuit is controlled by a logic circuit 46 such as an AND gate. This logic circuit can also be constituted of a CMOS circuit. Since a drive voltage VDD of the logic circuit 46 is lower than the reference voltage VHT, this logic circuit 46 can be constituted of a low voltage CMOS circuit. However, it is preferable like an embodiment to be described later that a circuit may be involved for making the low voltage CMOS circuit drive the high voltage CMOS circuit. It is also preferable that the drive voltage VDD is generated from the voltage VH or VHT by using a similar level shift circuit.

If necessary, at least the nMOS transistor 45 of the high voltage CMOS circuit may be made of the DMOS transistor 20 shown in FIG. 1A.

It is preferable to raise the breakdown voltage between the channel and drain of the pMOS transistor 44 of the high voltage CMOS circuit. To this end, it is preferable to use as the pMOS transistor 44 a pMOS transistor formed by inverting the conductivity type of the source, drain and channel of the nMOS transistor 30 shown in FIG. 1B.

Instead of using a DMOS transistor, the logic circuit 46 such as an AND gate may be made of a transistor having the same structure as the transistor 30, or a general MOS transistor without the low impurity concentration region (electric field relaxing region).

It is also preferable to form the pMOS transistor 44 of the high voltage CMOS circuit and the pMOS transistor of the logic circuit 46 in separated n-type well regions applied with different potentials.

Since the source follower transistor 42 of the level shift circuit has the low impurity concentration region 19, the source of the source follower transistor will not be broken down even if a reverse bias voltage of 15 V or higher is applied across the source and well regions.

As described above in detail, although the drain breakdown voltage is generally paid attention, according to the invention, a high reliability semiconductor device can be provided by raising the source breakdown voltage.

In this embodiment, if necessary, a DMOS transistor is used as the switching element 41, and a transistor, which is different from a DMOS transistor and has the characteristics (at least one selected from threshold value, breakdown voltage, substrate current and the like) different from those of the DMOS transistor, is used for at least a circuit portion of the circuit for driving the switching element 41. It is therefore possible to provide a semiconductor device having insulated gate type transistors capable of flowing a large current through the load and capable of realizing high breakdown voltage, energy saving, and high integration.

If the low impurity concentration regions 16 and 19 are disposed to the same depth as the well region 2, the low impurity concentration regions 16 and 19 and well region 2 can be formed by the same processes.

A liquid jet head manufactured by using the semiconductor device described above has: the semiconductor device; an electrothermal conversion body as a load connected to the switching element of the semiconductor device; and a jet port for jetting out liquid such as ink. In order to suppress a consumption power while increasing the heat generation amount of the electrothermal conversion body, it is preferable to raise the resistance value of the electrothermal conversion body and raise its drive voltage (VH). The invention is therefore suitable for driving such a load.

First Embodiment

Next, the first embodiment of the invention will be described with reference to the accompanying drawings. The cross sectional structures of the switching element and the source follower transistor are the same as those shown in FIGS. 1A and 1B.

The transistors 20 and 30 shown in FIGS. 1A and 1B having different characteristics are integrated by using the same substrate 1 such as a silicon substrate, together with the load shown in FIG. 2 to constitute an integrated circuit.

In FIG. 2, the load 43 is an electrothermal conversion body having a resistance value of RH, and the DMOS transistor 20 is connected as the switching element 41 to the low potential side wiring line 48. The MOS transistor 30 is used as the source follower transistor 42 for the level shift and supply of the high potential side reference voltage VHT of the CMOS inverter. The transistor constituting the logic circuit is made of a general MOS transistor without the low concentration region (electric field relaxing region) different from the CMOS transistor shown in FIG. 1B.

The pMOS transistor 44 of the CMOS inverter circuit is made of a MOS transistor having the low impurity concentration drain region (electric field relaxing drain region).

The nMOS transistor 45 of the CMOS inverter circuit is made of a DMOS transistor.

Figure 3:
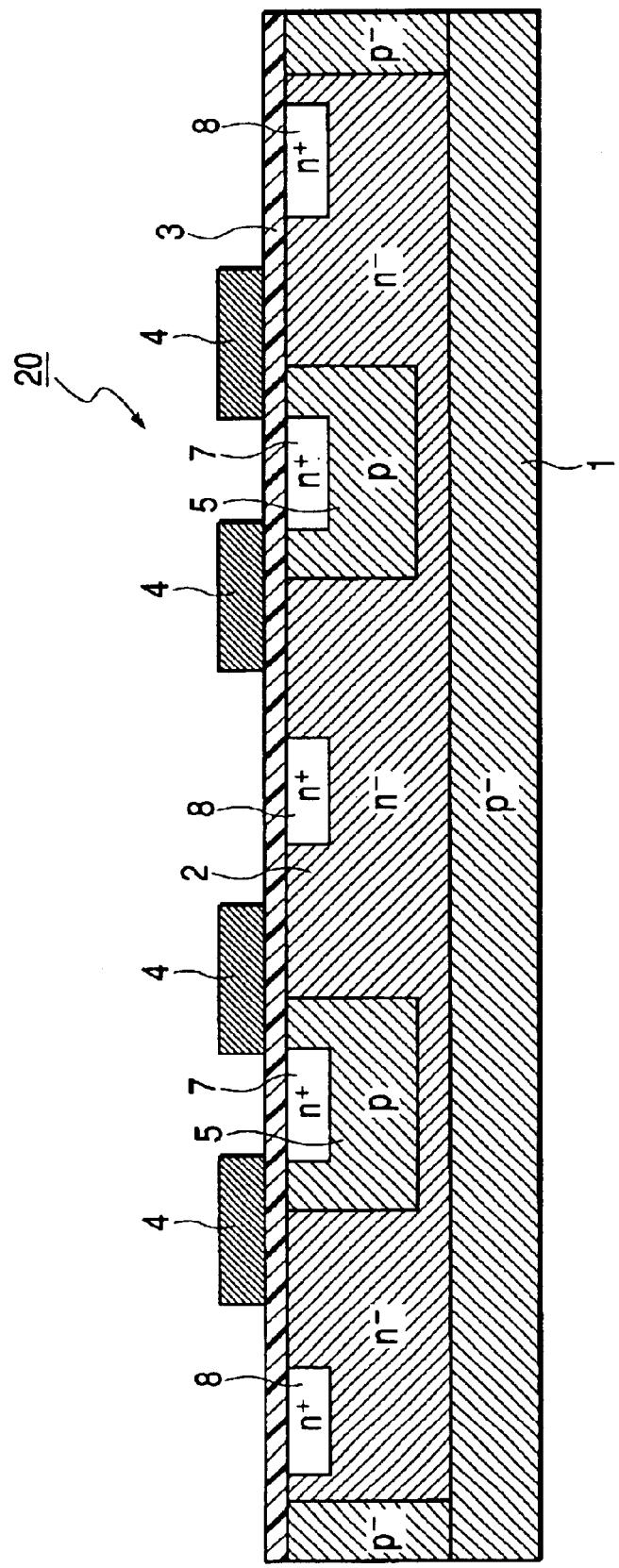
FIG. 3 is a cross sectional view of a switching element used by the invention.

FIG. 3 is a cross sectional view showing a preferred example of one MOS transistor used by the switching element 41.

As shown in FIG. 3, it is preferable to use, as the switching elements 41, DMOS transistors having sources and drains disposed alternately on the same substrate. This structure is equivalent to that a plurality of DMOS transistors are connected in parallel so that a large current can be flowed through the load 43 as a passive element.

Figure 4:
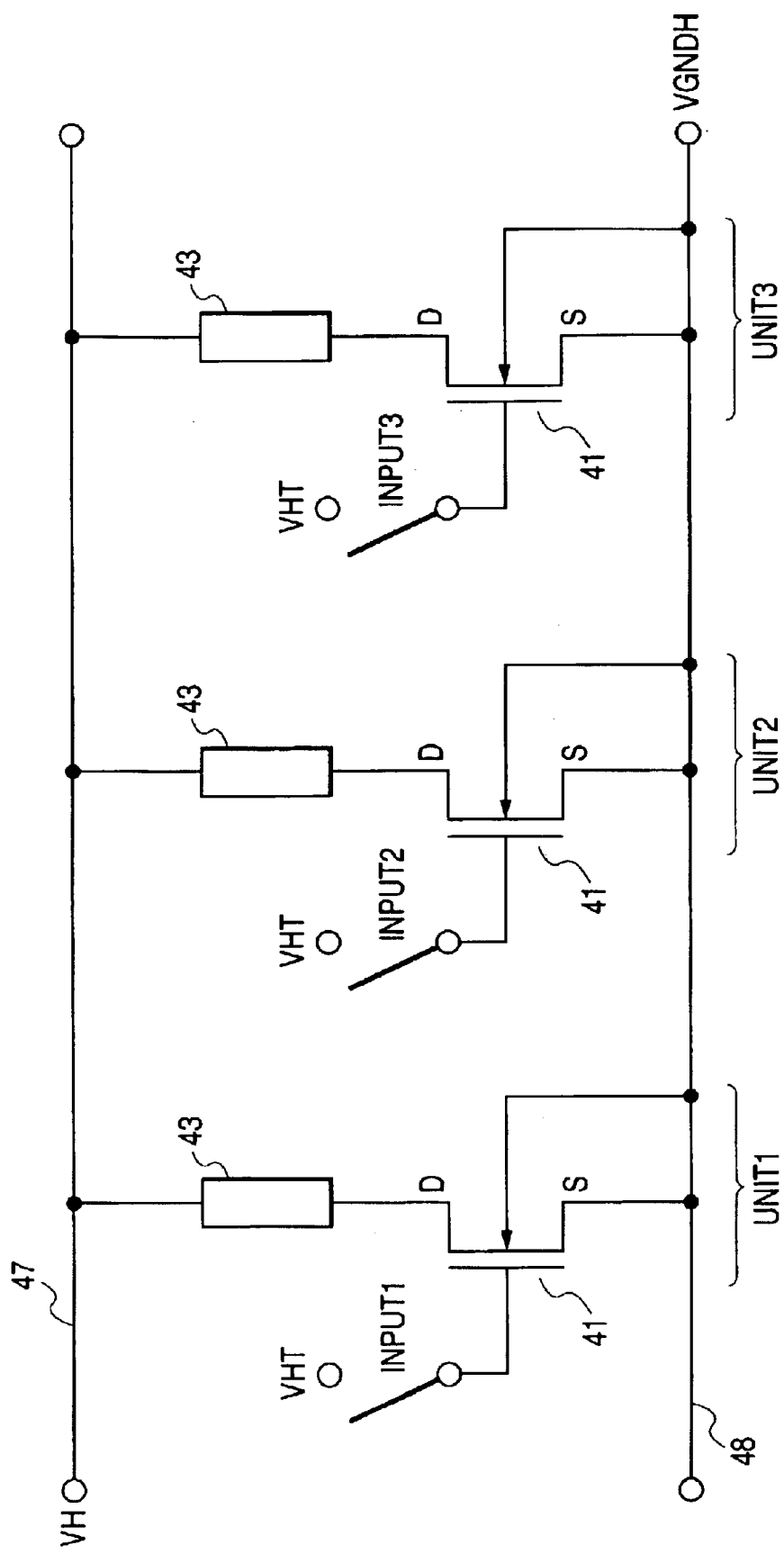
FIG. 4 is a diagram illustrating the operation of a semiconductor device according to an embodiment of the invention.

FIG. 4 is a schematic diagram of a circuit capable of selectively driving a plurality of loads. In this example, the circuit portion corresponding to three units is shown. Each unit has a load 43, a switching element 41 for flowing current through the load, and a switch for driving the switching element 41.

As described with reference to FIG. 2, as the middle level drive voltage VHT is supplied to the control gate electrode of the switching element 41, the switching element 41 turns on and current flows through the load connected to the switching element 41.

If such units are disposed on a semiconductor substrate in an array, this semiconductor circuit can be used as a recording apparatus which utilizes heat.

Next, the manufacture processes for the semiconductor device of this embodiment will be described.

FIGS. 5A to 5E are cross sectional views illustrating each manufacture process for an semiconductor device according to the first embodiment.

Figure 5A:
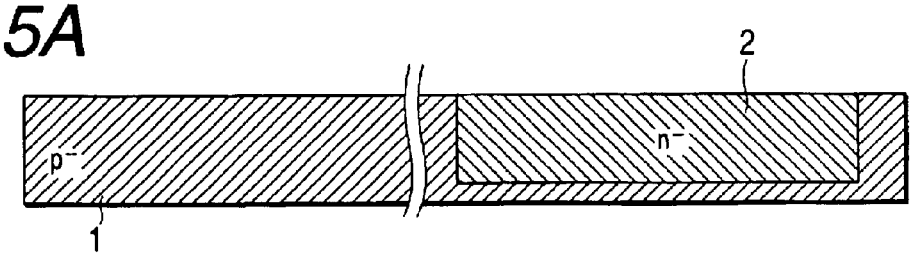
FIGS. 5A, 5B, 5C, 5D and 5E are cross sectional views illustrating the manufacture processes for a semiconductor device according to a first embodiment of the invention.

As shown in FIG. 5A, in the surface layer of a p-type semiconductor substrate 1, an n-type well region 2 is formed. This n-type well region 2 is selectively formed, for example, by implanting ions into the p-type semiconductor substrate 1. The n-type well region 2 may be formed by growing an epitaxial layer on the whole surface of the p-type semiconductor substrate 1 and selectively forming the p-type well region in the epitaxial layer.

Figure 5B:
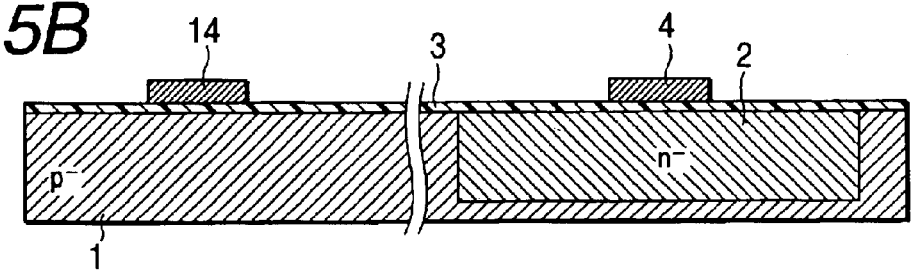

Next, as shown in FIG. 5B, on the n-type well region 2, a gate oxide film 3 is grown to a thickness of about 50 nm, for example, by hydrogen combustion oxidization. On the gate oxide film 3, polysilicon is deposited to a thickness of about 300 nm, for example, by low pressure chemical vapor deposition (LPCVD). The polysilicon is made to have a desired wiring resistance, for example, by doping phosphorous at the same time when the polysilicon is deposited by LPCVD or after the deposition by ion implantation or solid state diffusion. Thereafter, the polysilicon is etched and patterned by photolithography to form gate electrodes 4 and 14 of transistors. In this case, the first gate electrode 4 is formed above the n-type well region 2 and the second gate electrode 14 is formed above the p-type semiconductor substrate 1.

Figure 5C:
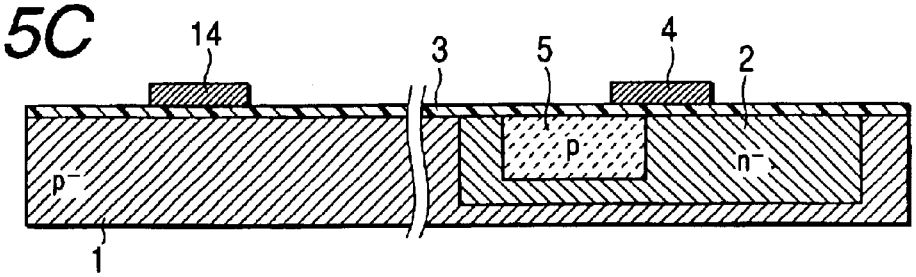

Next, as shown in FIG. 5C, photoresist (not shown) is coated and patterned by photolithography. By using the photoresist pattern and the gate electrode 4 as a mask, p-type impurity ions, e.g., boron ions, are selectively implanted. Heat treatment is performed for 60 minutes at 1100° C. in an electric furnace to thereby form a base region 5 in the well region 2. This heat treatment determines the channel region of the DMOS transistor 20 so that the heat treatment conditions are determined by the depth, impurity concentration and impurity type of the well region 2 and the depth and impurity type of the base region 5.

Figure 5D:
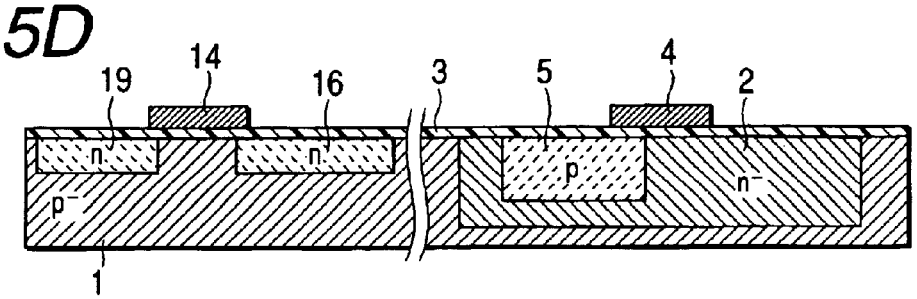

Next, as shown in FIG. 5D, photoresist (not shown) is coated and patterned by photolithography. By using the photoresist pattern and the gate electrode 14 as a mask, n-type impurity ions, e.g., phosphorous ions, are selectively implanted to form a lightly doped drain region 16 and a lightly doped source region 19 aligned with the right and left edges of the gate electrode 14. These regions 16 and 19 provide main factors for determining the breakdown voltage and on-resistance of the MOS transistor 30. In order to obtain desired impurity concentration and depth, heat treatment is performed, for example, for 30 minutes at 1000° C. in an electric furnace.

Figure 5E:
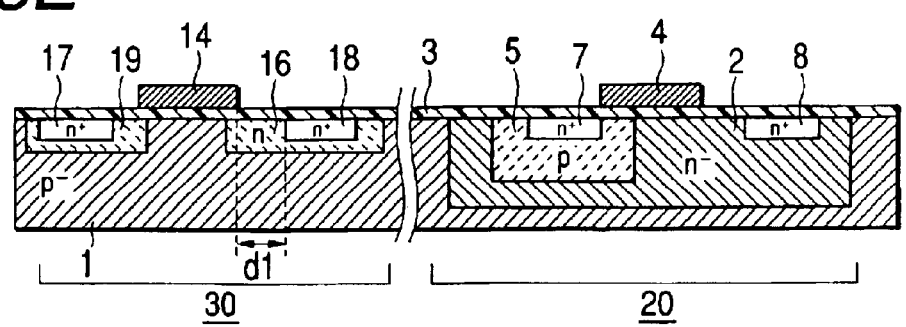

Next, as shown in FIG. 5E, a source region 7 and a high impurity concentration drain region 8 of the DMOS transistor and a source region 17 and high impurity concentration drain region 18 of the nMOS transistor are formed by implanting, e.g., arsenic ions and heat treatment is performed, for example, for 30 minutes at 950° C. in an electric furnace. The source region 7 is formed by ion implantation using the gate electrode as a mask so that the source region 7 can be formed in self alignment with the gate electrode.

Thereafter, although not shown, an oxide film is deposited by CVD to form an interlayer insulating film. Contact holes are formed through the interlayer insulating film in areas corresponding to the high impurity concentration source and drain regions 7, 8, 17 and 18 and gate electrodes 4 and 14. Conductive material is deposited and patterned to form a wiring pattern and complete the integrated circuit. If necessary, multilayer wiring patterns may be formed. When the wiring patterns are formed, the electrothermal conversion body as the load 43 can be formed.

There is no practical problem even if the on-resistance of the MOS transistor 30 is higher than that of the DMOS transistor 20. There also arises no problem if the operation breakdown voltage is maintained to some degree. It is therefore preferable that the ion dose when the lightly doped regions 16 and 19 are formed is about 1/10 to 1/10000 of the ion dose when the high impurity concentration drain and source regions 18 and 17 are formed, and it is sufficient if the depth of the drain and source regions 18 and 17 is about 2/3 to 1/10 of that of the base region 5.

The high impurity concentration drain region 18 is formed spaced apart by a distance d1 from the edge of the gate electrode 14. Although this distance d1 is not constant in terms of the balance with the DMOS transistor 20, it is preferable to set the distance d1 to about 1.0 μm to 5.0 μm.

Figure 6A:
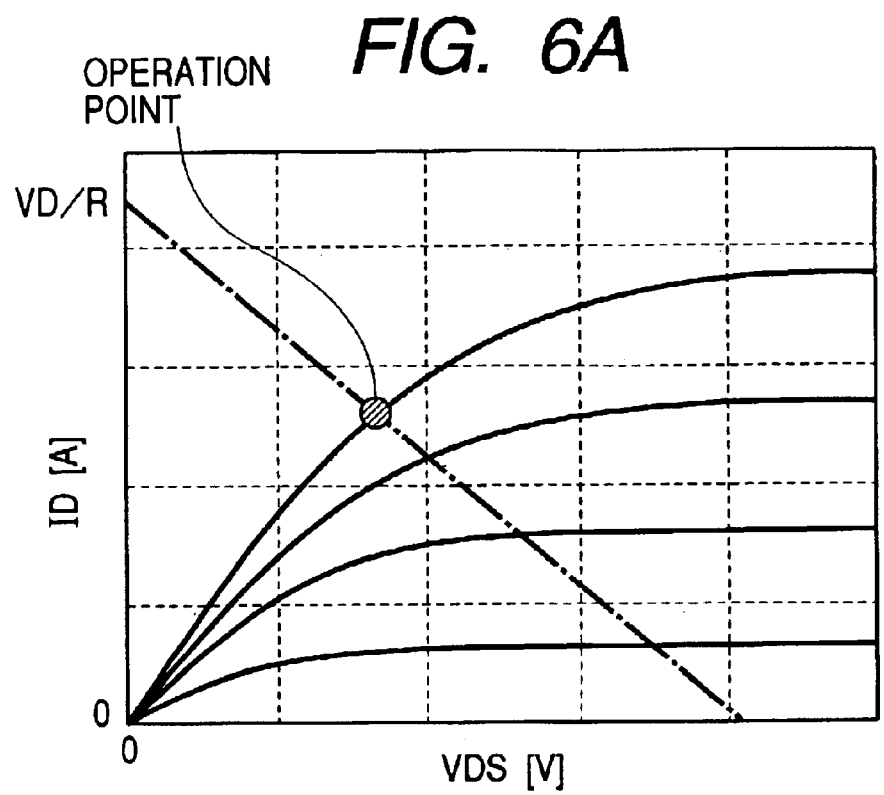
FIGS. 6A and 6B are graphs showing the electrical characteristics of a DMOS transistor used by the invention.
Figure 6B:
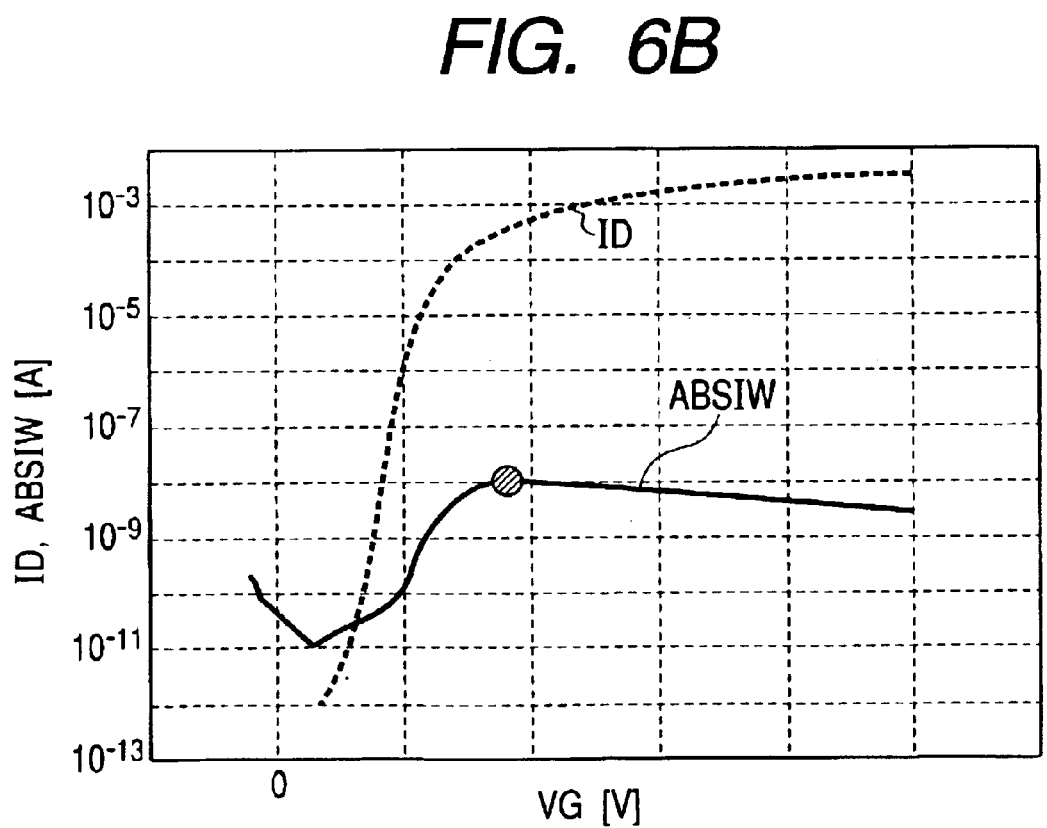
Figure 7A:
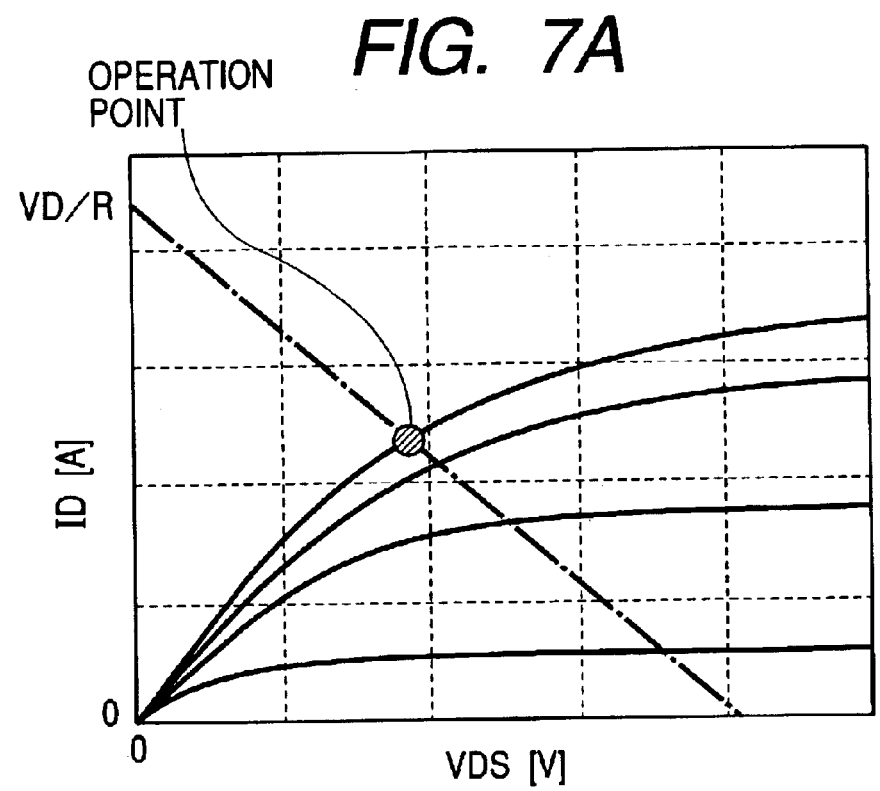
FIGS. 7A and 7B are graphs showing the electrical characteristics of a MOS transistor used by the invention.
Figure 7B:
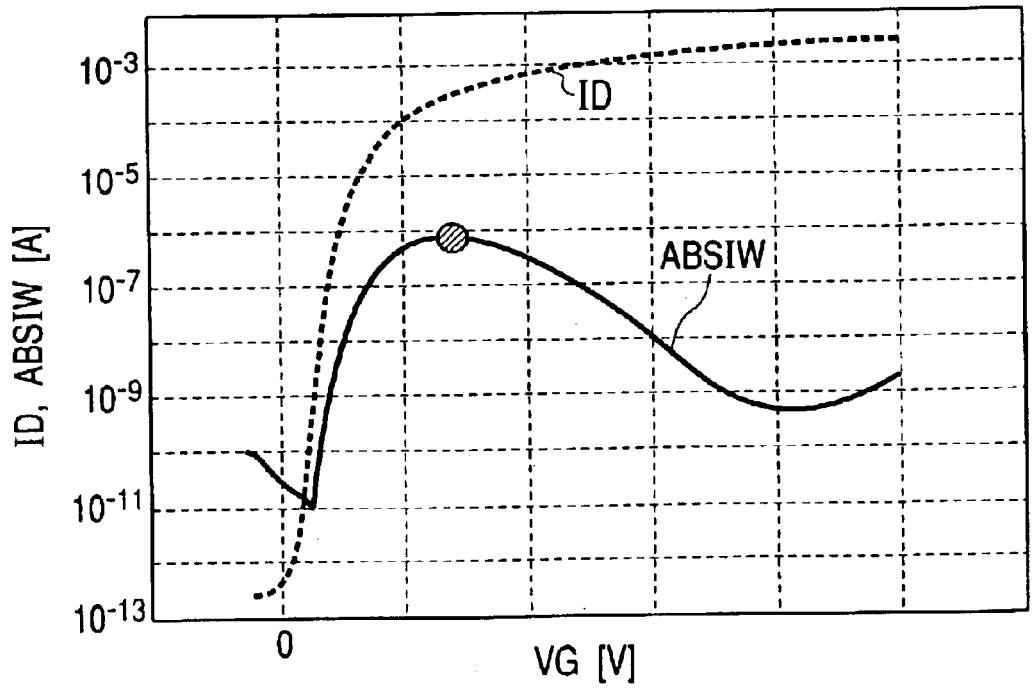

FIGS. 6A and 6B show typical examples of the VDS-ID (drain voltage-drain current) characteristics, the VG-ID (gate current-drain current) characteristics and the VG-ABSIW (gate voltage-absolute value of wafer current) characteristics, respectively of the DMOS transistor manufactured in the manner described above. Similarly, typical examples of the VDS-ID, VG-ID and VG-ABSIW characteristics of the MOS transistor are shown in FIGS. 7A and 7B. The operation range of a MIS type field effect transistor is controlled by a load resistance R and the operation breakdown voltage is determined by the largest substrate (wafer) current value represented by ABSIW in the operation range.

Second Embodiment

In this embodiment, the structure of the DMOS transistor constituting the switching element of the first embodiment is changed, and the other structures are the same as those of the first embodiment.

Figure 8:
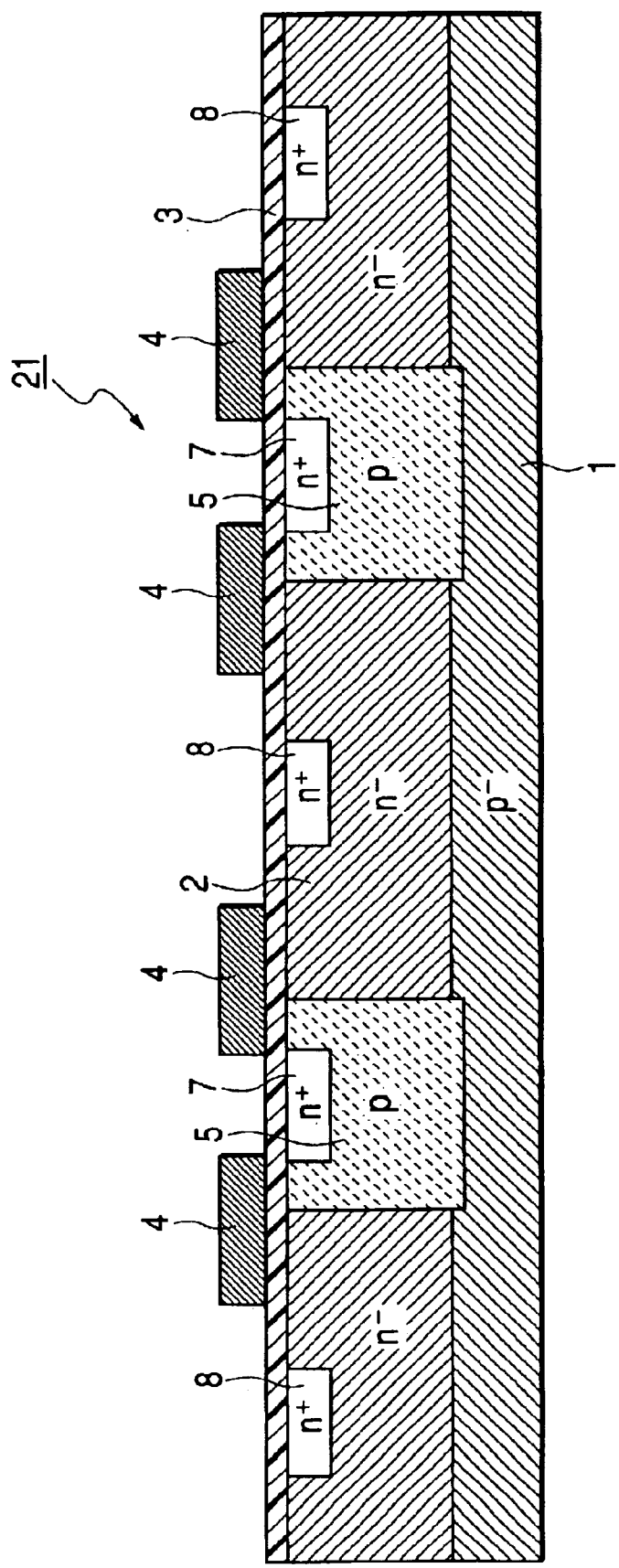
FIG. 8 is a cross sectional view of a DMOS transistor used by the invention.

FIG. 8 is a cross sectional view of a portion of a switching element array. A DMOS transistor 21 has a base region 5 reaching a p-type region of a substrate in order to perfectly separate in a lateral direction a well region 2 into partial well regions. With this structure, each drain in each segment can be electrically separated by itself.

Therefore, a dedicated element separation region as in the structure shown in FIG. 3 is not necessary. The occupied area becomes small, and the degree of freedom of designing DMOS transistors in parallel is high.

FIGS. 9A to 9E are cross sectional views illustrating each manufacture process for an semiconductor device according to the second embodiment of the invention.

Figure 9A:
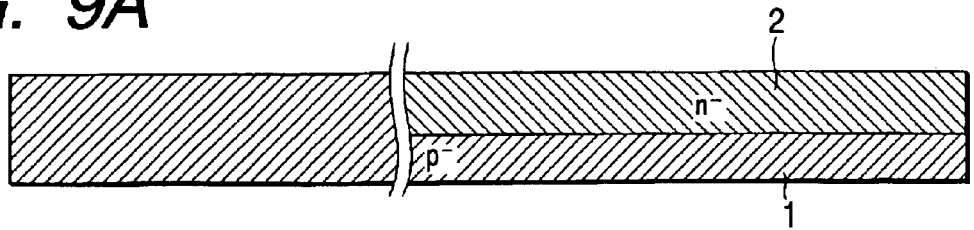
FIGS. 9A, 9B, 9C, 9D and 9E are cross sectional views illustrating the manufacture processes for a semiconductor device according to a second embodiment of the invention.
Figure 9B:
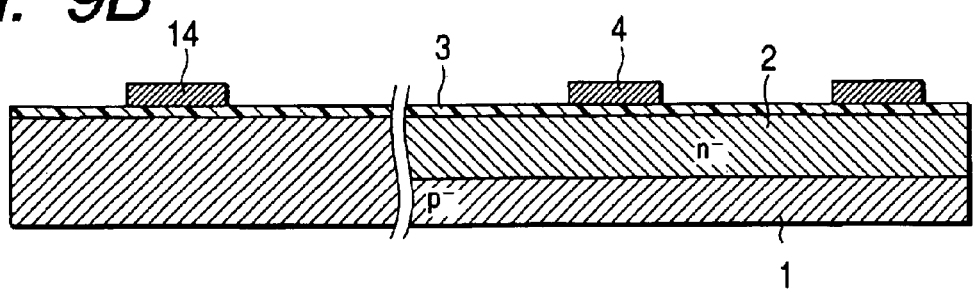

The processes shown in FIG. 9A and 9B are similar to those of the first embodiment, and so the processes to follow will be described.

Figure 9C:
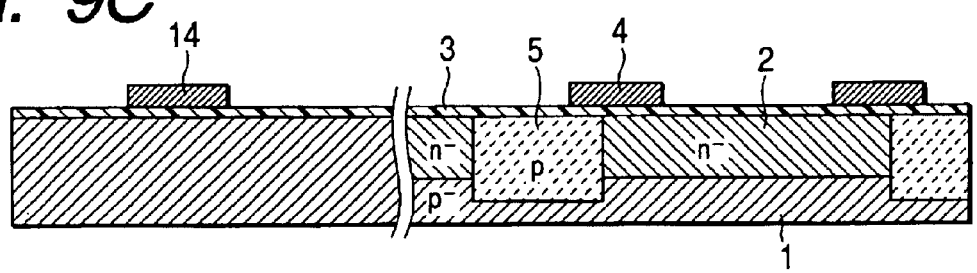

As shown in FIG. 9C, photoresist (not shown) is coated and patterned by photolithography. By using the photoresist pattern and the gate electrode 4 as a mask, p-type impurity ions, e.g., boron ions, are selectively implanted. Heat treatment is performed for 180 minutes at 1100° C. in an electric furnace to thereby form a base region 5 which electrically separates the well region 2.

It is important to design so that the base region 5 becomes deeper than the well region 2 in order for the heat treatment to separate the well region 2. The heat treatment conditions are determined by the depth, impurity concentration and impurity type of the well region 2 and the impurity concentration and impurity type of the base region 5. The impurity concentration of the base region 5 is selected from, for example, the range from $1 \times 10^{15} cm^{-3}$ to $1 \times 10^{19} cm^{-3}$.

Figure 9D:
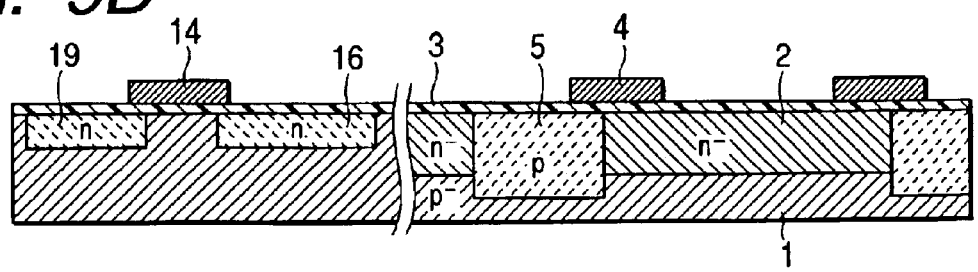

As shown in FIG. 9D, photoresist (not shown) is coated and patterned by photolithography. By using the photoresist pattern and the gate electrode 14 as a mask, n-type impurity ions, e.g., phosphorous ions, are selectively implanted to form a lightly doped drain region 16 and a lightly doped source region 19 aligned with the right and left edges of the gate electrode 14. The impurity concentration of these regions 16 and 19 is selected in the range from $1 \times 10^{15} cm^{-3}$ to $1 \times 10^{18} cm^{-3}$. In order to obtain desired impurity concentration and depth, heat treatment may be performed for 30 minutes at 1000° C. in an electric furnace.

Figure 9E:
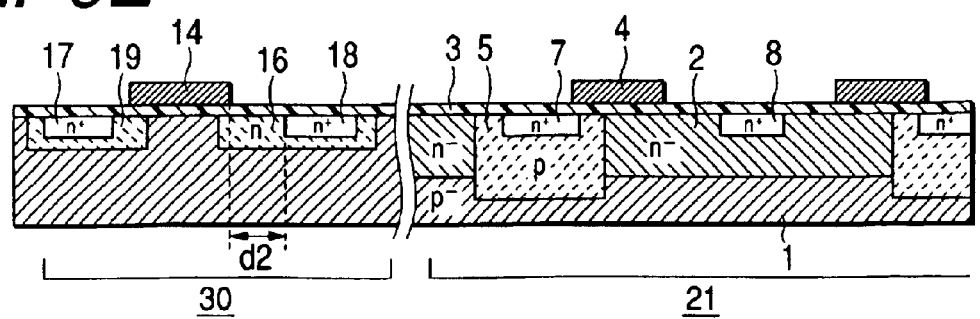

Next, as shown in FIG. 9E, a source region 7 and a high impurity concentration drain region 8 of the DMOS transistor 21 and a source region 17 and high impurity concentration drain region 18 of the nMOS transistor are formed by implanting, e.g., arsenic ions and heat treatment is performed, for example, for 30 minutes at 950° C. in an electric furnace. The source region 7 is formed by ion implantation using the gate electrode as a mask so that the source region 7 can be formed in self alignment with the gate electrode. A distance d2 is designed in the manner similar to that for the distance d1, and the source and drain can be formed symmetrically. The n-type impurity concentration of the high impurity concentration drain and source regions 18 and 17 at the most upper surface is selected, for example, in the range from $1 \times 10^{18} cm^{-3}$ to $1 \times 10^{22} cm^{-3}$.

Thereafter, although not shown, an oxide film is deposited by CVD to form an interlayer insulating film. Contact holes are formed through the interlayer insulating film in areas corresponding to the high impurity concentration source and drain regions 7, 8, 17 and 18 and gate electrodes 4 and 14. Conductive material is deposited and patterned to form a wiring pattern and complete the integrated circuit. If necessary, multilayer wiring patterns may be formed. When the wiring patterns are formed, the electrothermal conversion body as the load 43 can be formed.

Third Embodiment

Figure 10B:
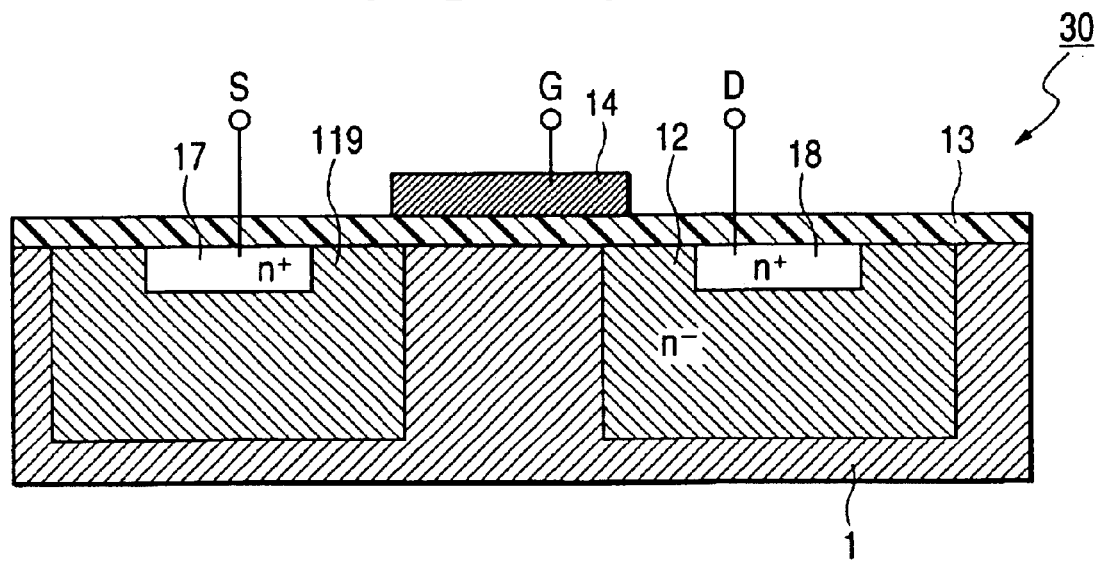
FIG. 10B is a cross sectional view of a drive circuit element used by the present invention.
Figure 11A:
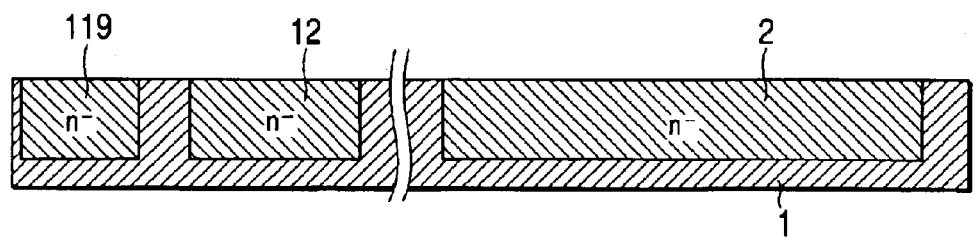
FIGS. 11A, 11B, 11C and 11D are cross sectional views illustrating the manufacture processes for a semiconductor device according to a third embodiment of the invention.

Next, the third embodiment of the invention will be described with reference to the accompanying drawings. FIGS. 11A and 10B are cross sectional views showing the structures of a switching element and a source follower of the third embodiment. FIGS. 11A to 11D are schematic cross sectional views illustrating the manufacture processes.

Figure 10A:
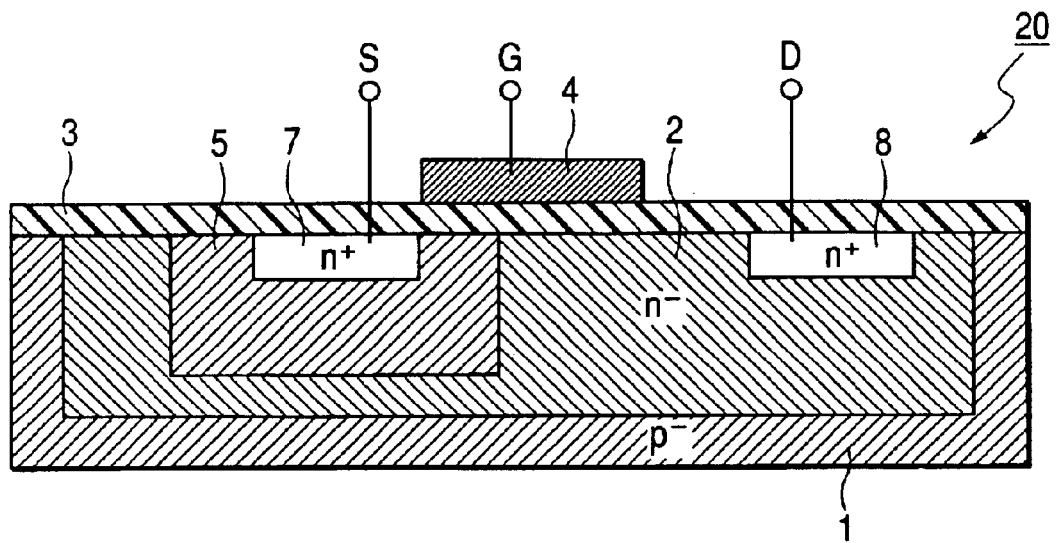
FIG. 10A is a cross sectional view of a switching element used by the present invention.

A DMOS transistor 20 shown in FIG. 10A has the same structure as that shown in FIG. 1A.

A MOS transistor 30 has a low impurity concentration drain region 12 on the drain side and a low impurity concentration source region (second doped region) 119 on the source side. The MOS transistor 30 also has a high impurity concentration drain region 18 and a high impurity concentration source region (first doped region) 17 respectively disposed being spaced apart from the pn junction between the channel and low impurity concentration region and from the gate electrode. The high impurity concentration drain region 18 is connected to a drain electrode and the high impurity concentration source region 17 is connected to a source electrode.

The regions 12 and 119 have the depth same as that of the well region 2 of the DMOS transistor 20 and the impurity concentration same as that of the well region 2. Therefore, the regions 12 and 119 can be formed at the same time when the well region 2 of the DMOS transistor 20 is formed. The regions 12 and 119 can be formed without increasing the number of masks and the manufacture cost.

The nMOS transistor 30 shown in FIG. 10A and the DMOS transistor 20 shown in FIG. 10B can be integrated on the same semiconductor substrate such as a silicon substrate. In this manner, the circuit structure such as shown in FIG. 2 can be realized.

FIGS. 11A to 11D are cross sectional views illustrating each manufacture process for an semiconductor device according to the third embodiment of the invention.

As shown in FIG. 11A, in the surface layer of a p-type semiconductor substrate 1, n-type well regions 2, 12 and 119 are formed. These n-type well regions 2, 12 and 119 are selectively formed, for example, by implanting ions into the p-type semiconductor substrate 1. The n-type well regions 2, 12 and 119 may be formed being spaced apart from each other by forming an epitaxial layer on the whole surface of the p-type semiconductor substrate 1 and selectively forming the n-type well regions in the epitaxial layer.

Figure 11B:
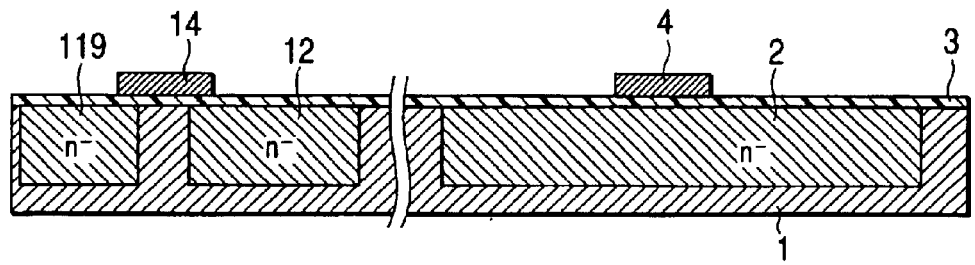

Next, as shown in FIG. 11B, on the p-type semiconductor substrate 1, a gate oxide film 3 is grown to a thickness of about 50 nm, for example, by hydrogen combustion oxidization. On the gate oxide film 3, polysilicon is deposited to a thickness of about 300 nm, for example, by LPCVD. Thereafter, the polysilicon is etched and patterned by photolithography to form a first gate electrode 4 of the DMOS transistor 20 and a second gate electrode 14 of the offset MOS transistor 30. In this case, the first gate electrode 4 is formed above the first n-type well 2 and the second gate electrode 14 is formed above the surface where the pn junction between the second n-type well regions 12 and 119 and the semiconductor substrate 1 terminates.

Figure 11C:
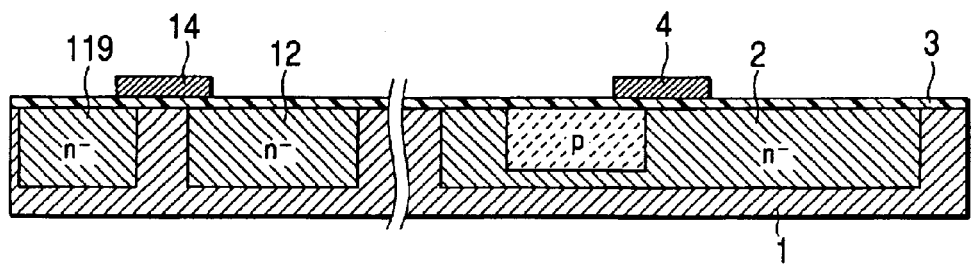

Next, as shown in FIG. 11C, photoresist (not shown) is coated and patterned by photolithography. By using the photoresist pattern and the gate electrode 4 as a mask, p-type impurity ions, e.g., boron ions, are selectively implanted. Heat treatment is performed for 60 minutes at 1100° C. in an electric furnace to thereby form a base region 5 in the well region 2.

Figure 11D:
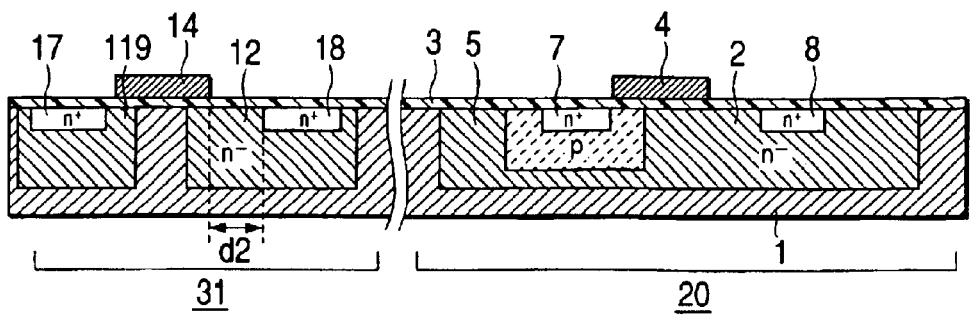

Next, as shown in FIG. 11D, a source region 7 and a high impurity concentration drain region 8 of the DMOS transistor and a source region 17 and high impurity concentration drain region 18 of the nMOS transistor are formed by implanting, e.g., arsenic ions and heat treatment is performed, for example, for 30 minutes at 950° C. in an electric furnace. The source region 7 is formed by ion implantation using the gate electrode as a mask so that the source region 7 can be formed in self alignment with the gate electrode.

Thereafter, although not shown, an oxide film is deposited by CVD to form an interlayer insulating film. Contact holes are formed through the interlayer insulating film in areas corresponding to the high impurity concentration source and drain regions 7, 8, 17 and 18 and gate electrodes 4 and 14. Conductive material is deposited and patterned to form a wiring pattern and complete the integrated circuit. If necessary, multilayer wiring patterns may be formed. When the wiring patterns are formed, the electrothermal conversion body as the load 43 can be formed.

According to the third embodiment, the regions 12 and 119 of the offset MOS transistor shown in FIG. 10B can be formed by the n-type well regions, the DMOS transistor and nMOS transistor can be integrated without increasing the number of masks.

Fourth Embodiment

In the fourth embodiment, the structure of the DMOS transistor constituting the switching element of the third embodiment is changed. The other structures are the same as those of the third embodiments.

The cross section of a portion of the switching element array of the semiconductor device of this embodiment is the same as that shown in FIG. 8. A DMOS transistor 21 has a base region 5 reaching a p-type region of a substrate in order to perfectly separate in a lateral direction a well region 2 into partial well regions. With this structure, each drain in each segment can be electrically separated by itself.

Therefore, a dedicated element separation region as in the structure shown in FIG. 3 or 11A is not necessary. The occupied area becomes small, and the degree of freedom of designing DMOS transistors in parallel is high.

FIGS. 12A to 12D are cross sectional views illustrating each manufacture process for an semiconductor device according to the fourth embodiment of the invention.

Figure 12A:
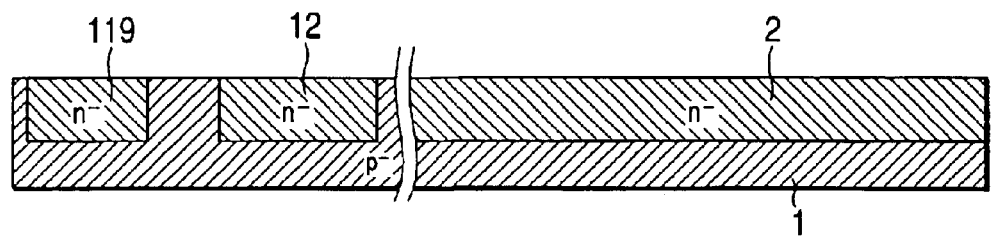
FIGS. 12A, 12B, 12C and 12D are cross sectional views illustrating the manufacture processes for a semiconductor device according to a fourth embodiment of the invention.

As shown in FIG. 12A, a semiconductor substrate 1 made of p-type single silicon or the like is prepared and n-type impurities such as phosphorous and arsenic are implanted to form n-type wells 2, 12 and 119 at the same time.

Figure 12B:
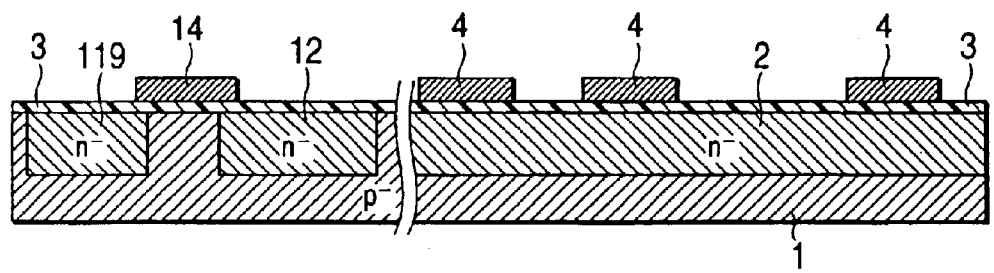

As shown in FIG. 12B, the surface of the substrate is oxidized to form a gate insulating film 3. Thereafter, gate electrodes 4 and 14 are formed by the processes similar to those of the third embodiment.

Figure 12C:
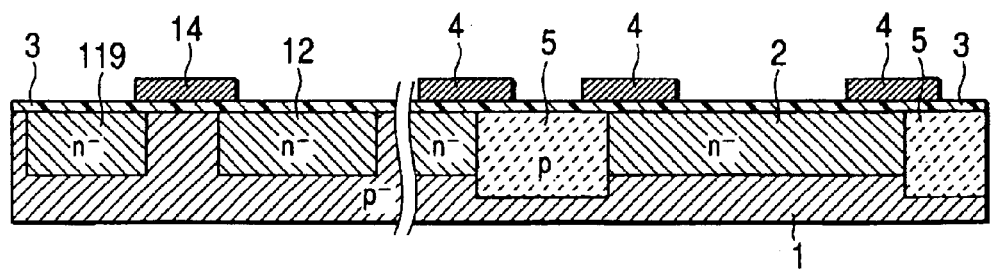

As shown in FIG. 12C, photoresist (not shown) is coated and patterned by photolithography. By using the photoresist pattern and the gate electrode 4 as a mask, p-type impurity ions, e.g., boron ions, are selectively implanted. Heat treatment is performed for 180 minutes at 1100° C. in an electric furnace to thereby form a base region 5 which electrically separates the well region 2. It is important to design so that the base region 5 becomes deeper than the wall region 2 in order for the heat treatment to separate the well region 2. The heat treatment conditions are determined by the depth, impurity concentration and impurity type of the well region 2 and the impurity concentration and impurity type of the base region 5.

Figure 12D:
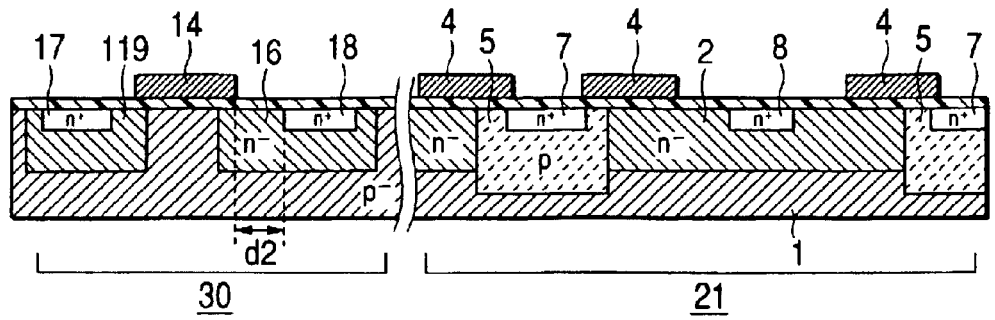

Next, as shown in FIG. 12D, a source region 7, a high impurity concentration drain region 8, a source region 17 and a high impurity concentration drain region 18 are formed by implanting, e.g., arsenic ions and heat treatment is performed, for example, for 30 minutes at 950° C. in an electric furnace. The source region 7 is formed by ion implantation using the gate electrode as a mask so that the source region 7 can be formed in self alignment with the gate electrode. A distance d2 is designed in the manner similar to that for the distance d1.

Thereafter, although not shown, an oxide film is deposited by CVD to form an interlayer insulating film. Contact holes are formed through the interlayer insulating film in areas corresponding to the high impurity concentration source and drain regions 7, 8, 17 and 18 and gate electrodes 4 and 14. Conductive material is deposited and patterned to form a wiring pattern and complete the integrated circuit. If necessary, multilayer wiring patterns may be formed. When the wiring patterns are formed, the electrothermal conversion body as the load 43 can be formed.

Fifth Embodiment

Figure 13:
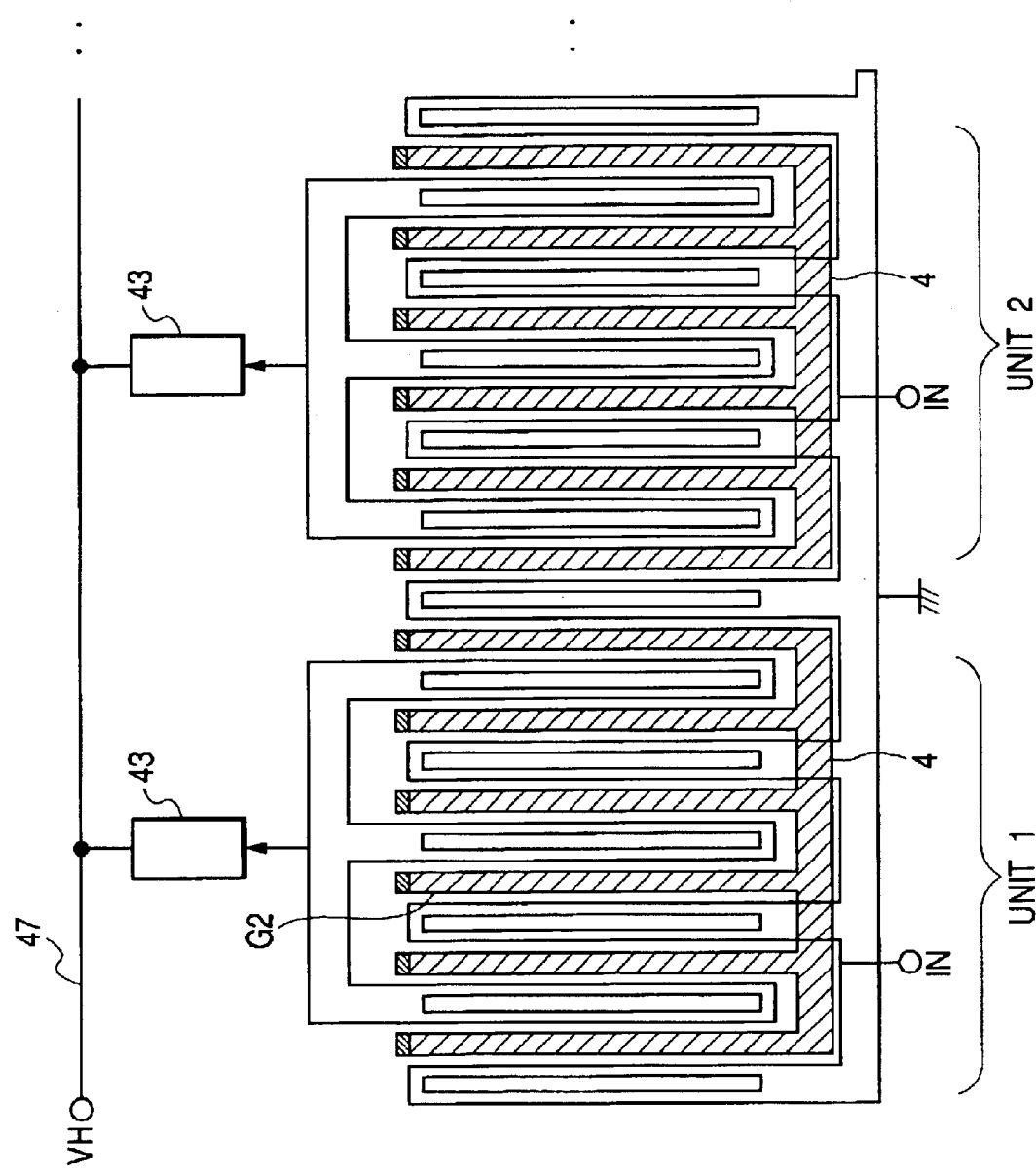
FIG. 13 is a top view of a switching element of a semiconductor device according to a fifth embodiment of the invention.

The fifth embodiment pertains to improvement on a DMOS transistor array. The plan view of the array is shown in FIG. 13. Only two units among a number of units the semiconductor device has are shown.

In adjacent DMOS transistors without a dedicated element separation region, adjacent three drain regions are connected in common and a common terminal is connected to one load 43 such as an electrothermal conversion body.

Source regions of all DMOS transistors are connected in common. The source region is disposed on both opposite sides of the three drains via a gate electrode. The source is short-circuited to the base region which provides the channel of the DMOS transistor.

The cross section of the DMOS transistors taken along the array direction has a repetition of a predetermined pattern such as shown in FIG. 8 in any unit or in any region between adjacent units.

The cross sections of the DMOS transistor and the nMOS transistor may take the cross sections of each of the above-described embodiments.

Sixth Embodiment

Figure 14:
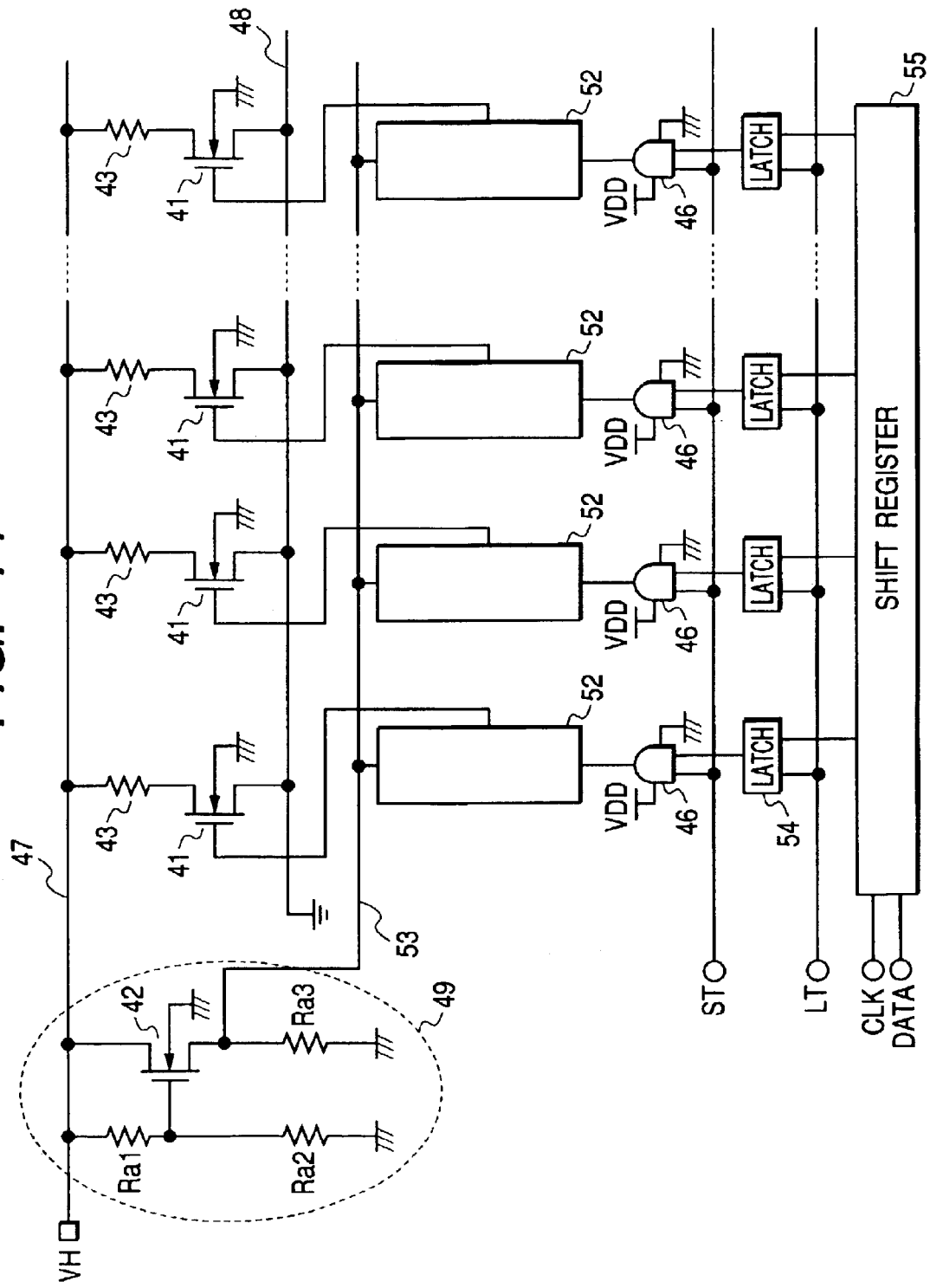
FIG. 14 is a circuit diagram of a semiconductor device according to a sixth embodiment of the invention.

FIG. 14 is a circuit diagram of a semiconductor device of the sixth embodiment.

In FIG. 14, reference numeral 43 represents a load such as an electrothermal conversion element. An switching element 41 of a DMOS transistor such as shown in FIG. 13 is connected between the load 43 and a low potential side wiring line 48 applied with a low reference voltage VGNDH.

A circuit for driving the switching element 41 has, for example, a level shift circuit 49, a CMOS circuit 52, a logic circuit 46, a latch 54 and a shift register 55. The power supply voltage for the logic circuit 46, latch 54 and shift register 55 is a low voltage of 5 V or 3.3 V.

The CMOS circuit 52 is connected to the gate of the switching element 41. The logic circuit 46 such as an AND gate is connected to an input terminal of the CMOS circuit 52. A level shift circuit 49 for supplying a middle reference voltage VHT is connected to the high potential side of the CMOS circuit 52.

As shown, the level shift circuit 49 is a source follower circuit of a MOS transistor 42. The level shift circuit 49 generates a low middle reference voltage VHT of several V to ten and several V from a high reference voltage VHT supplied from a high potential side wiring line 47.

The reference voltage VHT can be applied to the control electrode (gate) of the switching element 41 via the CMOS circuit 52.

Figure 15:
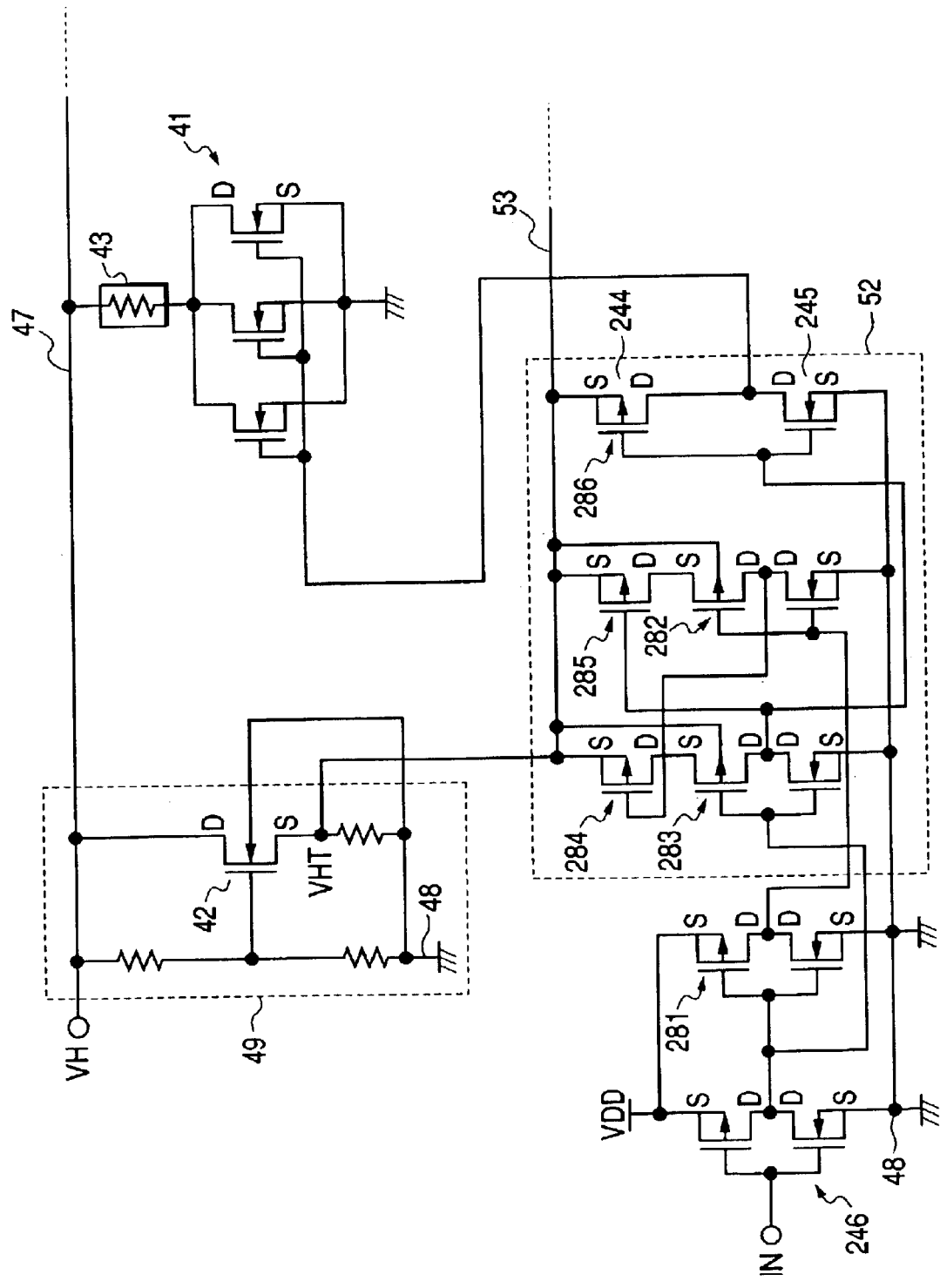
FIG. 15 is a circuit diagram of the semiconductor device according to the sixth embodiment of the invention.

FIG. 15 shows the circuit structure of one unit of the circuit shown in FIG. 14.

Three DMOS transistors without the element separation region are connected in parallel as the switching element.

The load is connected to the drain high potential side wiring line 47 of the source follower transistor 42 of the level shift circuit 49 so that the power supply voltage VH of 33 V is applied. The source of the source follower transistor 42 is connected to the wiring line 53 which applies the reference voltage of, e.g., 15 V. The p-type well region (channel) of the source follower transistor 42 is connected to the low potential wiring line 48 which applies a voltage of, e.g., 0 V.

The output stage of the logic circuit 46 has a CMOS inverter 246 made of a low voltage CMOS circuit. An output of the logic circuit 46 is input to the next stage CMOS inverter 281 and then to a CMOS inverter 283 respectively made of a low voltage CMOS circuit.

An output of the inverter 283 is input to a CMOS inverter 286 made of a high voltage CMOS circuit.

An output from a CMOS inverter 282 made of a CMOS circuit and receiving an output of the inverter 281 is input to the gate of a pMOS transistor (MOS switch) connected to the source of the inverter 283. An output of the inverter 283 is also input to the gate of a pMOS transistor 285 connected to the source of the inverter 282.

When a high level signal (H signal) is input to the inverter 283, the H signal is synchronously input to the pMOS transistor 284 so that the pMOS transistor 284 turns off. Conversely, when a low level signal (L signal) is input to the inverter 283, the L signal is synchronously input to the pMOS transistor 284 so that the pMOS transistor 284 turns on. When the H signal is input to the inverter 282, the pMOS transistor 285 turns off. Conversely, when the L signal is input to the inverter 282, the pMOS transistor 285 turns on. In other words, the pMOS transistor 284 and the pMOS transistor of the inverter 283 operate synchronously to take the same state, and the pMOS transistor 285 and the pMOS transistor of the inverter 282 operate synchronously to take the same state.

When the L signal is input to an input terminal IN, the inverter 246 outputs the H signal which is input via the next stage inverter 283 to the inverter 286. Therefore, the H signal of 15 V from the CMOS circuit 52 is input to the gate of the switching element 41 which turns on and flows a large current through the load 43.

Conversely, when the H signal is input to the input terminal IN, the inverter 246 outputs the L signal which is input to the next stage inverter 283. At this time, the pMOS transistor 284 receives the L signal via the two inverters 281 and 282 so that it turns on and the pMOS transistor of the inverter 283 also turns on so that the H signal is output to the inverter 286. Therefore, the L signal of 0 V from the CMOS circuit 52 is applied to the gate of the switching element 41 which turns off and stops the current supply to the load 43.

As described above, the voltage conversion circuit receives the low voltage signal from the low voltage CMOS inverter 246 and outputs the high voltage signal to the high voltage CMOS inverter 286. The voltage conversion circuit is structured in such a manner that the pMOS transistor 284 is connected to the inverter 283, and the circuit constituted of the pMOS transistor 285 and inverters 282 and 281 controls the pMOS transistor 284 and the PMOS transistor of the inverter 283 to take the on- or off-state at the same time.

In the voltage conversion circuit, the CMOS inverter and the source of the pMOS transistor constituting the CMOS inverter 283 are connected to the pMOS transistor 284 which takes the on- or off-state synchronously with the pMOS transistor of the CMOS inverter 283. The circuit is not limited only thereto. For example, the pMOS transistor of the CMOS inverter 283 may have a plurality of gate electrodes such as double gates and triple gates. In this case, the circuit diagram same as that shown in FIG. 15 can be applied. A signal of the same phase (even if there is some delay caused by passing through the inverter, it is considered the same phase) is input to the plurality of gates.

In the above manner, the low voltage CMOS circuit 246 having a low drive voltage can reliably drive and control the high voltage CMOS circuit 286 having a high drive voltage.

Figure 16:
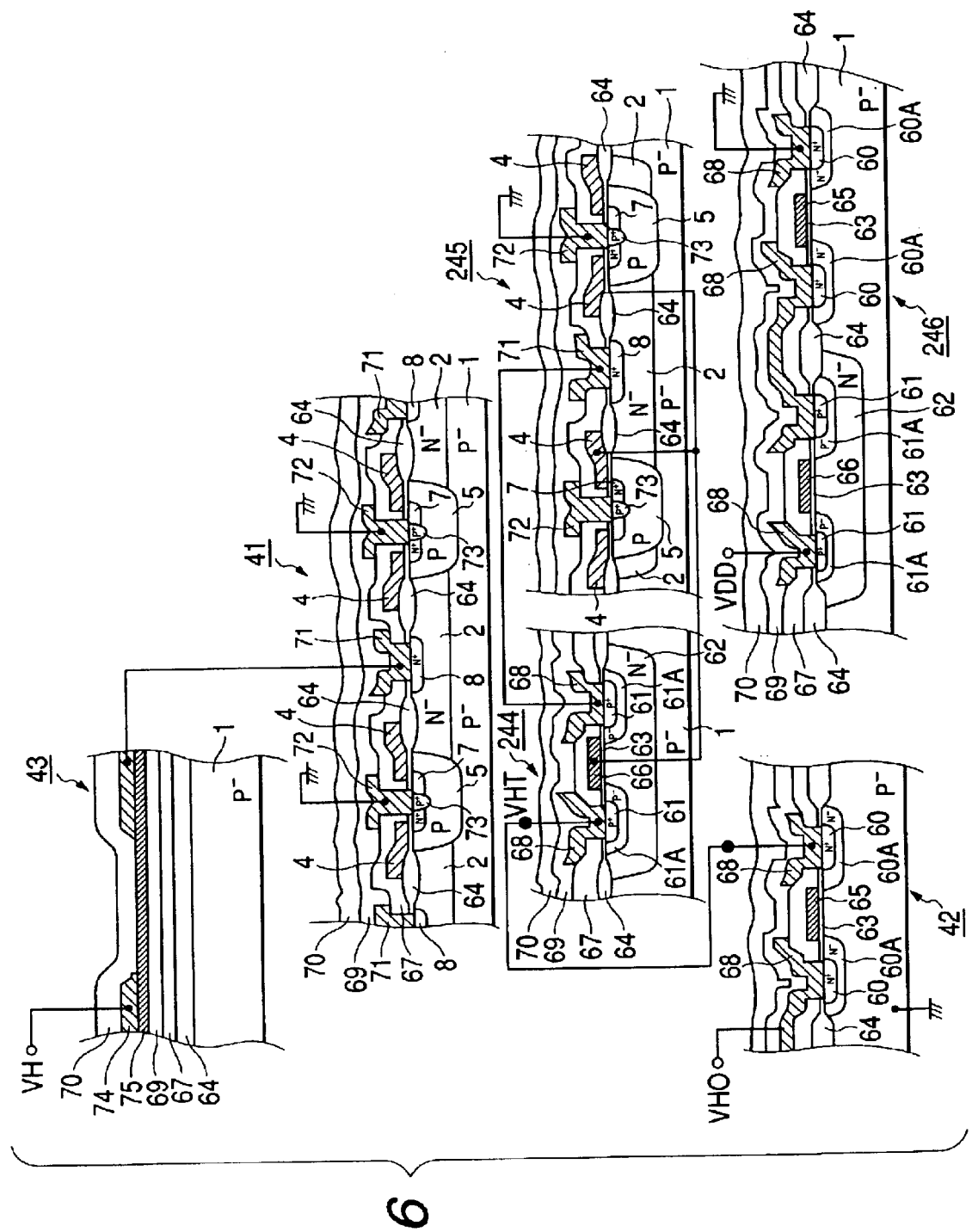
FIG. 16 is a cross sectional view illustrating the manufacture processes for the semiconductor device of the sixth embodiment.

FIG. 16 is a cross sectional view of a semiconductor device realizing the circuit shown in FIG. 15.

The load 43 is a thin film electrothermal conversion body which is constituted of a heat generating resistor layer 75 and a pair of electrodes 74. For example, the heat generating resistor layer 75 is formed on an interlayer insulating film 69 formed on an interlayer insulating film 67 which is formed on a field insulating film 64 formed on the surface of a p-type semiconductor substrate 1. The surface of the thin film electrothermal conversion body is covered with a protective layer 70.

The switching element 41 is made of a DMOS transistor whose p-type base region 5 is disposed deeper than the n-type region 2. The MOS transistor has, therefore, no dedicated element separation region. In order to further improve the breakdown voltage on the drain side, the field insulating film 64 is formed under the gate electrode 4 on the drain side. In order to electrically shorten the n-type source region 7 and p-type base region 5, a p-type high impurity concentration region 73 is formed under the source electrode 72 and deeper than the source region 7.

The high voltage source-grounded CMOS Inverter 286 is constituted of an nMOS transistor 245 and a pMOS transistor 244 respectively made of the DMOS transistor like the switching element 41. The pMOS transistor 244 has a p-type low impurity concentration region 61A and a p-type high impurity concentration region 61 formed in the region 61A, as its source and drain regions. This structure raises the breakdown voltage of at least the drain.

The low voltage CMOS inverter 246 is constituted of a pMOS transistor and an nMOS transistor respectively having the structure same as that of the transistor 244. Although the high breakdown voltage is not requested, low impurity concentration regions 60A and 61A are provided to relax the electric field concentration to be caused by fine patterning.

The source follower transistor 42 has an n-type low impurity concentration region 60A and an n-type high impurity concentration region 60 formed in the region 60A, as its source and drain regions. Both the source and drain breakdown voltages are high. A region formed at the same time when n-type well regions 2 and 62 are formed can be used as the low impurity concentration region 61A, as described with reference to FIGS. 10A and 10B.

Contact electrodes to wells are formed at predetermined positions (not shown) to make the potential at the n-type well region 62 of the transistor 244 be different from the potential at the n-type well region 62 of the CMOS inverter 246.

The pMOS transistor of the CMOS circuit 52 shown in FIG. 15 may adopt the same structure as that of the transistor 244. The nMOS transistor of the CMOS circuit 52 shown in FIG. 15 may adopt the same structure as that of the DMOS transistor 245.

The manufacture processes for the semiconductor device shown in FIG. 16 will be described.

A semiconductor substrate 1 is prepared which is made of single crystal silicon having a p-type low impurity concentration.

By implanting n-type impurities such as phosphorous and arsenic into predetermined regions of the semiconductor substrate 1, semiconductor regions of a low impurity concentration drain 2 of a DMOS transistor and an n-type well region 62 of a pMOS transistor are formed at the same time.

On the surface of the semiconductor substrate 1, a field oxide film 64 is formed which is made of relatively thick silicon oxide. This field insulating film 64 functions as the gate insulating film of the DMOS transistor on the drain side and also functions as the element separation region of CMOS transistors and the like.

After a gate insulating film 63 made of relatively thin silicon oxide is formed, an electrode material such as polysilicon is deposited and patterned to form gate electrodes 4, 65 and 66.

By using the gate electrode 4 as a mask, p-type impurities such as boron are implanted into the region where the source region of the DMOS transistor is to be formed, and thereafter heat treatment is performed to form a p-type base region 5 passing through the n-type semiconductor region 2. Next, the region where a pMOS transistor and DMOS transistor are to be formed is covered with a photoresist mask, and by using the gate electrode 65 and field insulating film 64 as a mask, n-type impurity ions such as phosphorous and arsenic are implanted into the regions where the source and drain regions of the nMOS transistor 42 are to be formed. Thereafter, heat treatment is performed to form n-type low impurity concentration semiconductor regions 60A.

Next, the region where the pMOS transistor is to be formed is covered with a photoresist mask, and by using the gate electrode 4 and field insulating film 64 as a mask, n-type impurity ions such as phosphorous and arsenic are implanted into the regions where the source and drain regions of the DMOS transistors 41 and 245 and the source and drain regions of the nMOS transistor 42 and the like are to be formed. Thereafter, heat treatment is performed to form n-type high impurity concentration regions 60.

By covering a predetermined region with a photoresist mask and using the gate electrode 66 as a mask, p-type impurity ions such as boron are implanted into the regions where the source and drain regions of the pMOS transistor 244 and the like are to be formed. Thereafter, heat treatment is performed to form p-type low impurity concentration regions 61A.

Ions of p-type impurities such as boron are implanted into the low impurity concentration region 61A of the pMOS transistor and into a portion 73 of the source region 7 of the DMOS transistor, and heat treatment is performed to form p-type high impurity concentration regions 61 and 73. In this case, in the DMOS transistor region, the p-type semiconductor region 73 is formed passing through the pn junction of the source region 7.

An insulating film 67 made of silicon oxide doped with phosphorous or boron is deposited, and contact holes are formed by etching through the insulating film in predetermined areas above the source, drain and gate.

In order to form a source electrode 72 and a drain electrode 71 of the DMOS transistor and the source and drain electrodes 68 of the MOS transistor, a conductor such as copper-containing aluminum is deposited and patterned to form a predetermined wiring pattern.

A first interlayer insulating film 69 of silicon oxide is deposited and through holes are formed at predetermined positions.

In order to form a heat generating resistor layer 75 of an electrothermal conversion element 43 as a load, hafnium boride, silicon tantalum nitride, tantalum aluminum or the like is deposited and then a conductor such as copper-containing aluminum is deposited. The conductor 74 and heat generating resistor layer 75 are patterned into a predetermined shape by dry etching, and a portion of the conductor 74 serving as the heat generation region is selectively removed.

A protective layer 70 made of silicon nitride or the like is deposited. If necessary, an anti-cavitation layer of tantalum or platinum may be formed on the protective layer 70.

With the above-described processes, the semiconductor device having the cross sectional structure shown in FIG. 16 can be obtained.

In this embodiment, by utilizing the field oxide film, the gate electrode on the drain side is vertically spaced apart from the semiconductor substrate and the edge of the high impurity concentration region to be formed in a self-alignment manner is laterally spaced apart from the base region 5. In this manner, the breakdown voltage of the drain region of the DMOS transistor can be improved further.

The semiconductor region 62 serving as an n-type well of the pMOS transistor is formed by the same process as that for the semiconductor region 2 serving as the low impurity concentration drain of the DMOS transistor, so that the manufacture cost of the CMOS circuit can be suppressed from being raised.

Without using the field insulating film, the structure such as shown in FIG. 8 may be applied to the DMOS transistor.

Seventh Embodiment

Figure 23:
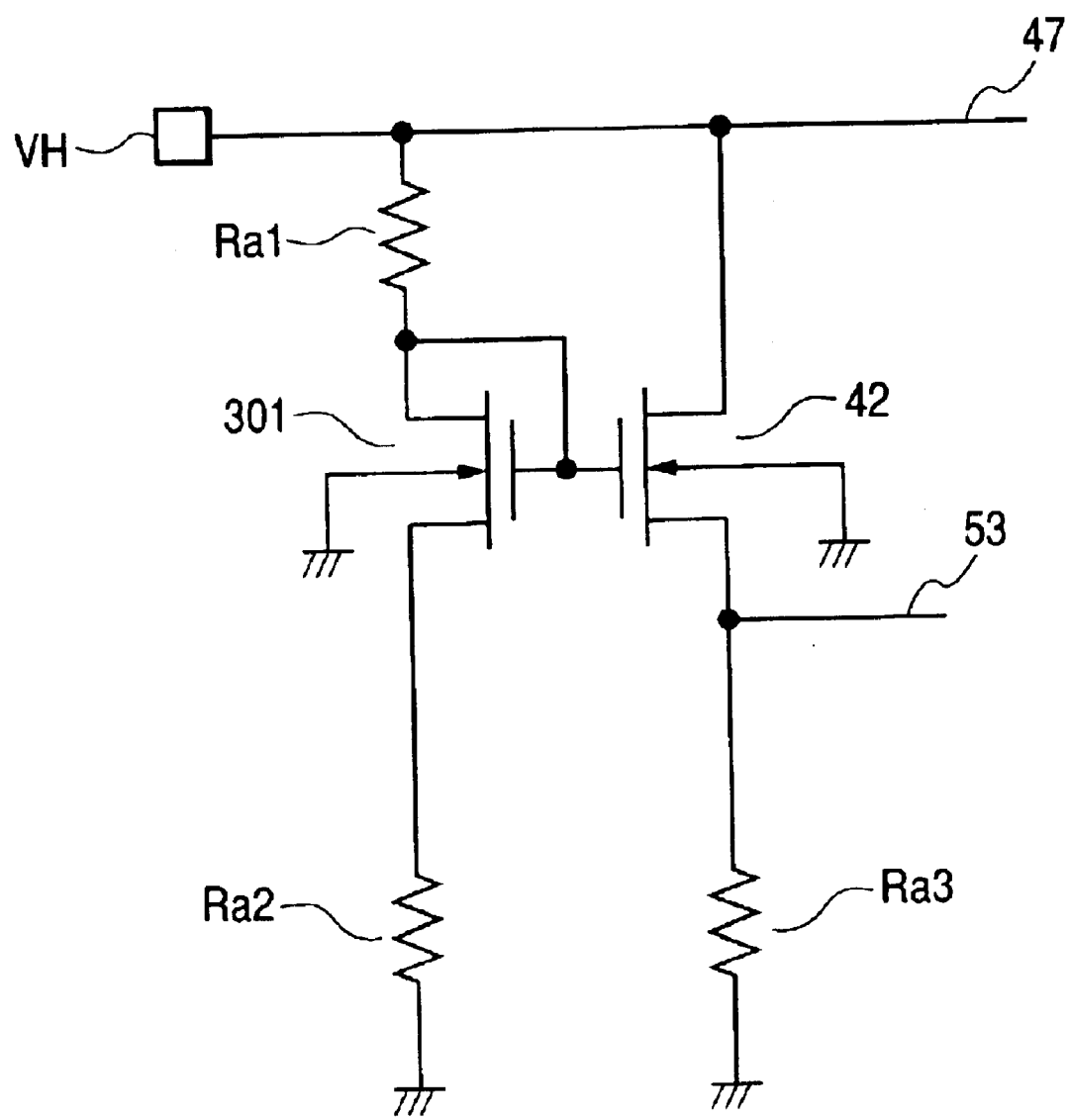
FIG. 23 is a circuit diagram showing an example of a level shift circuit.

The seventh embodiment provides a circuit which can solve the problem of a change in the gate-source voltage of a source follower transistor. FIG. 23 shows an example of a level shift circuit for generating a proper voltage from a power supply voltage VH. This circuit can mitigate the influence of a change in the gate-source voltage of a source follower 42 upon an output voltage $V_{53}$. An output voltage $V_{53}$ of the source follower shown in FIG. 14 is given by:

$$V_{53}=Ra2 \cdot VH/(Ra1+Ra2)-V_{gs42} \qquad (1)$$

where Ra1 is the resistance value of a resistor Ra1, Ra2 is the resistance value of a resistor Ra2, and $V_{gs42}$ is a gate-source voltage at 42. A change in $V_{gs}$ of the source follower transistor 42 directly influences the output voltage $V_{53}$.

In the circuit shown in FIG. 23, a diode-connected transistor 301 is inserted between the resistors Ra1 and Ra2. The gate and drain of the transistor 301 are connected to the gate of the source follower 42. An output voltage $V_{53}$ is given by:

$$V_{53}=Ra2 \cdot (VH-V_{gs301})/(Ra1+Ra2)-(V_{gs42}-V_{gs301}) \qquad (2)$$

where $V_{gs301}$ is a gate-source voltage of the transistor 301. If $V_{gs42}$ is equal to $V_{gs301}$, the influence of a change in the gate-source voltage of the source follower 42 is eliminated and the influence of a change in the gate-source voltage of the transistor 301 is mitigated by an amount corresponding to Ra2/(Ra1+Ra2). With this circuit structure, it is possible to mitigate the influence of a change in the gate-source voltage of a general level shift circuit made of a source follower. In addition, the breakdown voltage of the source of the source follower transistor can be improved.

Eighth Embodiment

Figure 24:
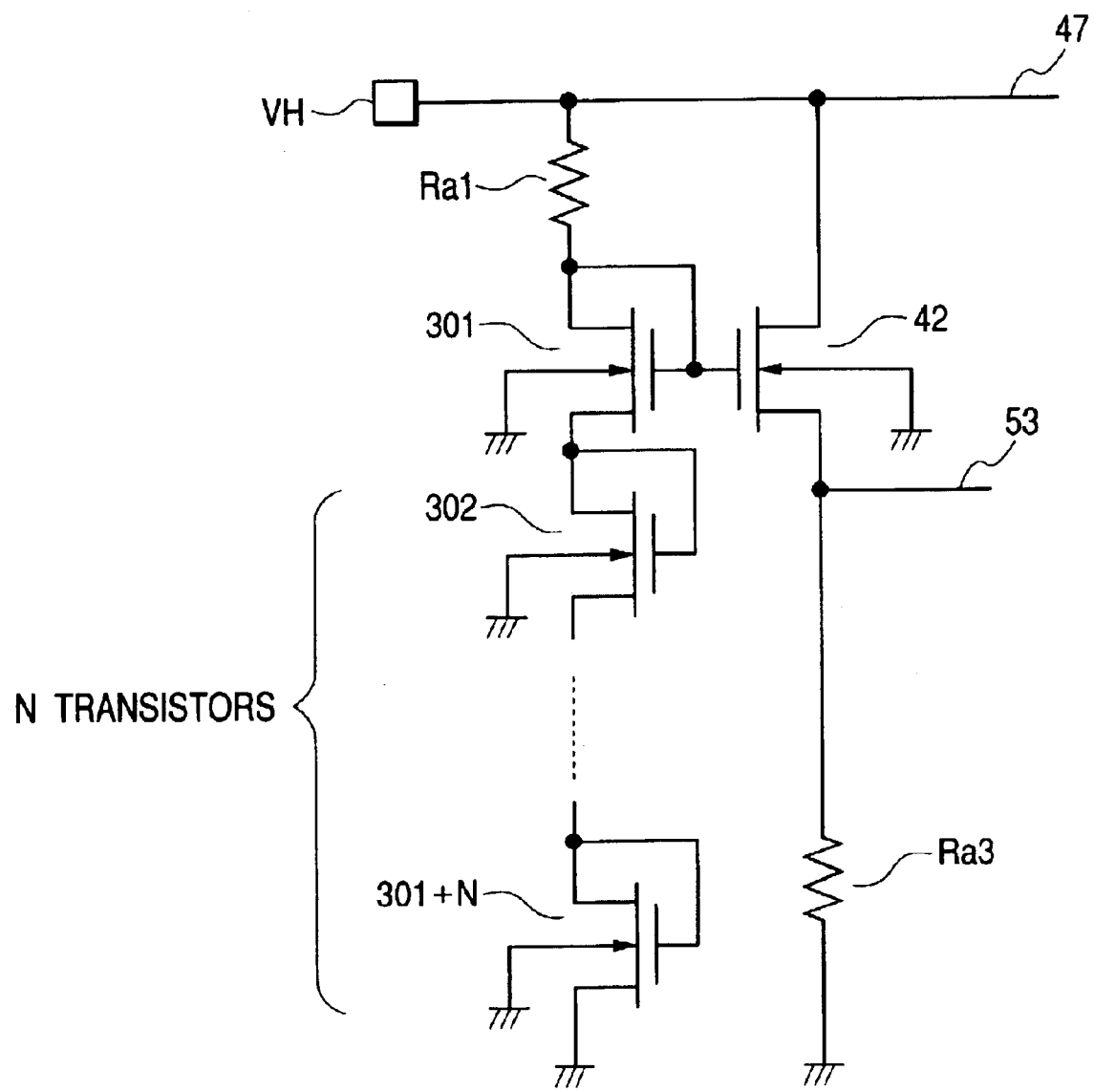
FIG. 24 is a circuit diagram showing another example of the level shift circuit.

The eighth embodiment provides a circuit which can solve the problem of an influence of a change in the power source voltage VH upon an output voltage $V_{53}$. FIG. 24 is a circuit diagram of this circuit of the eighth embodiment. FIG. 24 shows an example of a level shift circuit for generating a proper voltage from the power supply voltage VH. The arrangement of Ra1, Ra3, and transistors 42 and 301 is similar to that of FIG. 23. The different point is that in place of Ra2, a plurality of N diode-connected transistors 302 to (301+N) are serially connected. An output voltage $V_{53}$ of the circuit shown in FIG. 24 is given by:

$$V_{53}=V_{gs302}+\ldots,+V_{gs(301+N)} \quad (3)$$

An output voltage to be set is determined almost from the number of serially connected transistors. It is therefore possible to suppress a change in the output voltage to be caused by a change in the power supply voltage VH. With this circuit structure, it is possible to mitigate the influence of a change in the gate-source voltage of a general level shift circuit made of a source follower. In addition, the breakdown voltage of the source of the source follower transistor can be improved.

Ninth Embodiment

Figure 25:
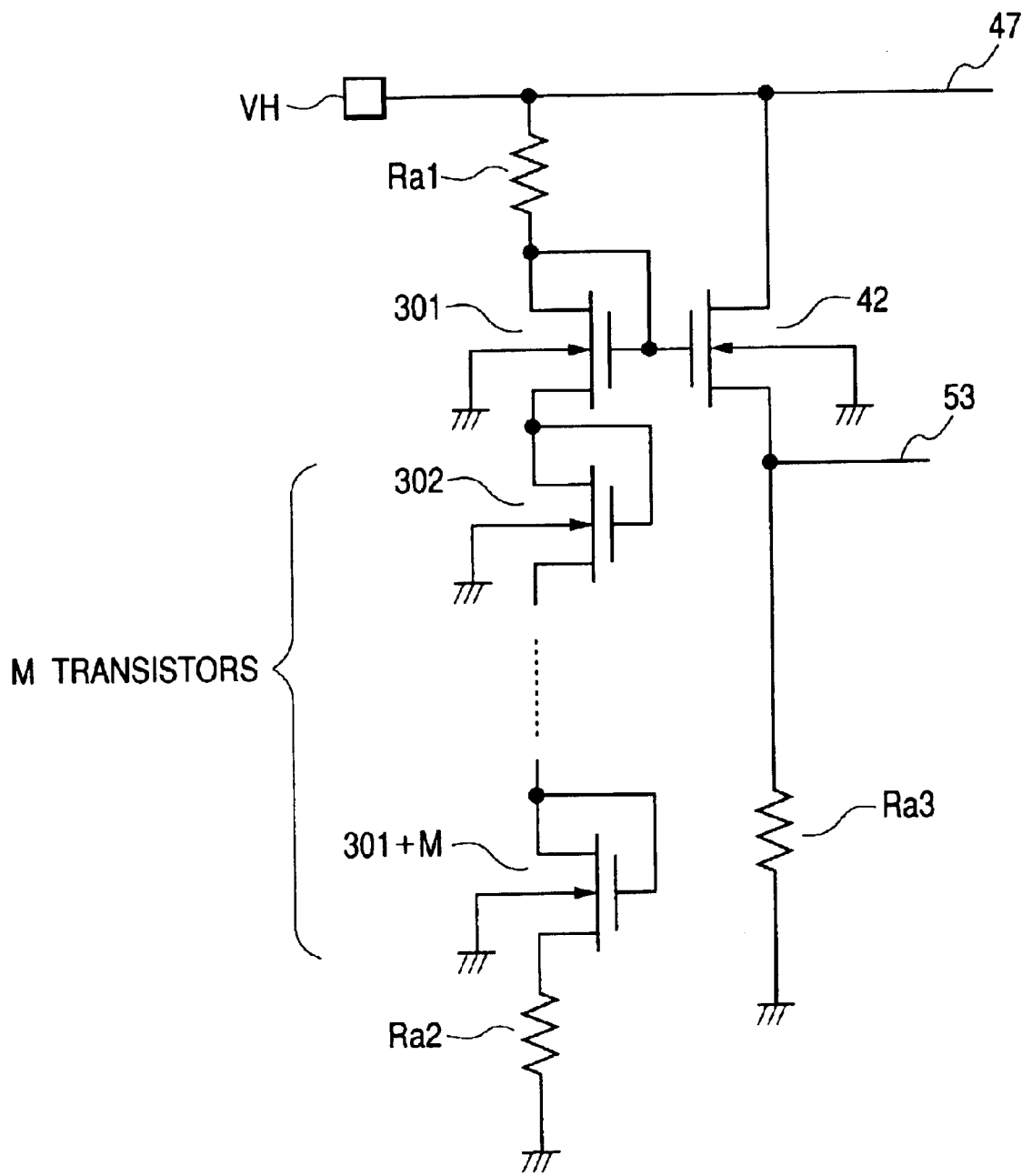
FIG. 25 is a circuit diagram showing another example of the level shift circuit.

The ninth embodiment provides a circuit which can solve both the problems associated with the seventh and eighth embodiments. FIG. 25 shows an example of a level shift circuit for generating a proper voltage from the power supply voltage VH. This circuit mitigates the influence of an output voltage $V_{53}$ by a change in the power supply voltage VH and a change in the gate-source voltage $V_{gs}$ of the transistor.

The arrangement of resistors Ra1, Ra3, and transistors 42 and 301 of the circuit shown in FIG. 25 is similar to that of the circuit shown in FIG. 24. The different point is that the transistors 302 to (301+M) (N>M) are serially connected to the transistor 301 and a resistor Ra2 is serially connected to the transistor (301+M). The number M of transistors and the resistor Ra2 are determined so as to minimize the change in VH and $V_{gs}$. An output voltage $V_{53}$ is given by:

$$V_{53}=Ra2\cdot\{VH-V_{gs301}-(V_{gs302}+\ldots,+V_{(gs(301+M)})\}/(Ra1+Ra2)+ (V_{gs302}+\ldots,+V_{(gs301+M)}) \quad (4)$$

Ra2 and M are determined to satisfy the following formula (5) and (6) derived from the equations (2), (3) and (4) when considering a change $\Delta V_{53}$ in the output voltage $V_{53}$ assuming that a change $\Delta V_{gs}$ in the gate-source voltage of the transistor takes a constant value because of manufacture processes:

$$Ra2\cdot(\Delta VH)/(Ra1+Ra2)+M(1-Ra3/(Ra1+Ra3))\cdot(\Delta V_{gs})-Ra2\cdot(\Delta V_{gs})/ (Ra1+Ra2)<Ra2\cdot(\Delta VH-\Delta V_{gs})/(Ra1+Ra2) \quad (5)$$

$$Ra2\cdot(\Delta VH)/(Ra1+Ra2)+M(1-Ra3/(Ra1+Ra3))\cdot(\Delta V_{gs})-Ra3\cdot(\Delta V_{gs})/ (Ra1+Ra3)<N(\Delta V_{gs}) \quad (6)$$

Tenth Embodiment

Figure 26:
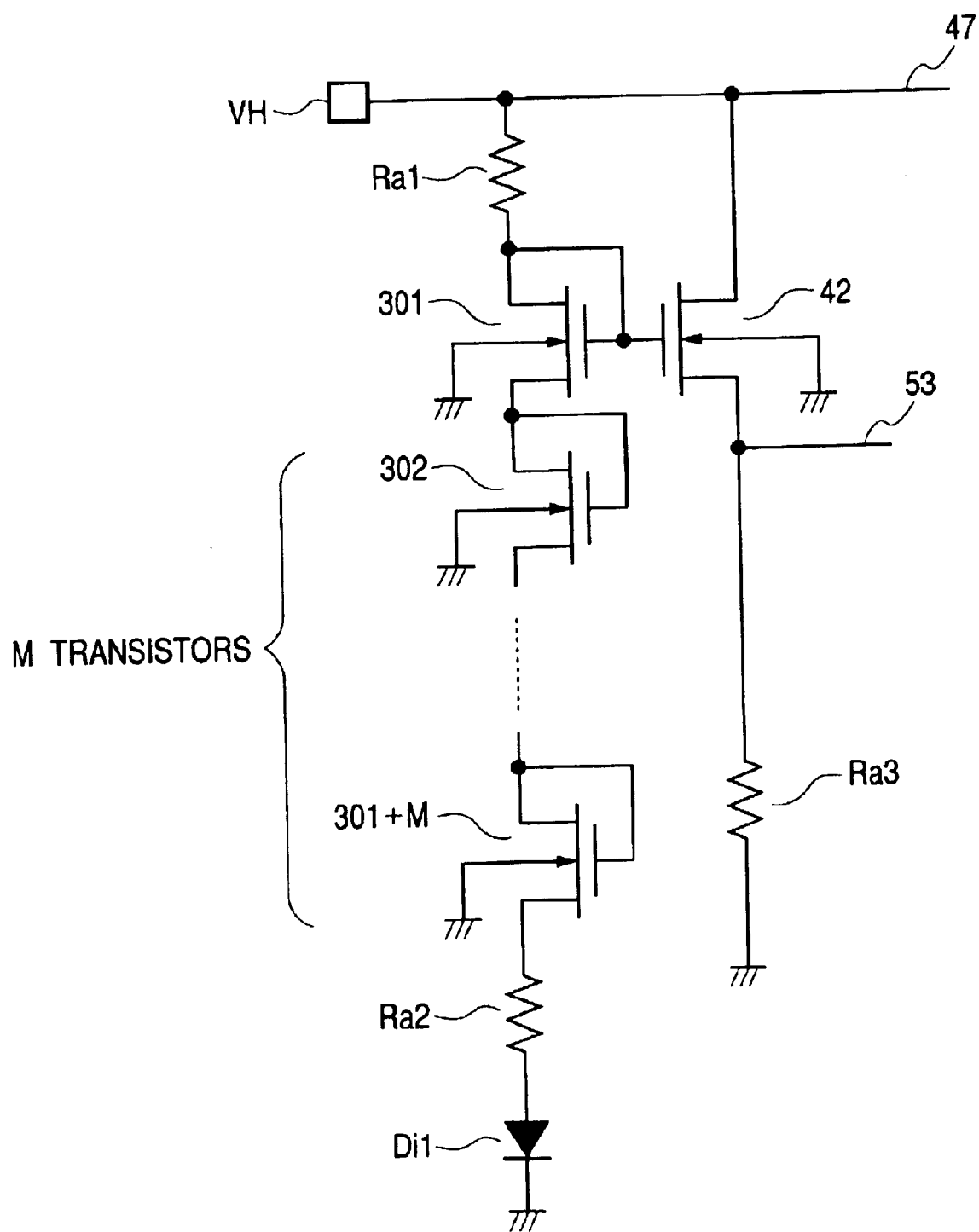
FIG. 26 is a circuit diagram showing another example of the level shift circuit.

FIG. 26 shows the circuit structure of a semiconductor device of the tenth embodiment. FIG. 26 shows an example of a level shift circuit for generating a proper voltage from the power supply voltage VH. This circuit mitigates the influence of a change in the power supply voltage VH and a change in the gate-source voltage $V_{gs}$ of the transistor upon the output voltage $V_{53}$. The arrangement of resistors Ra1, Ra2 and Ra3, and transistors 42 and 301 to (301+M) is similar to that of the circuit shown in FIG. 25. The different point is that a diode Di1 is serially connected to the resistor Ra2. A voltage VF across the diode is nearly equal to 0.7 V. This voltage is more stable than a variation of Vth of MOS transistors. Since VF∝Ln(I) where I is a current flowing through the diode, a change in VF is smaller than that of a diode-connected MOS transistor. An output voltage is given by:

$$V_{53}=Ra2\cdot(VH-(V_{gs302}+\ldots,+V_{gs(301+M)})-VF)/(Ra1+Ra2)+$$

$$M\cdot(V_{gs302}+\ldots,+V_{gs(301+M)})+VF \quad (7)$$

Since VF is added, it becomes possible to reduce the number M of transistors or the resistance value of the resistor Ra2. A change in the output voltage $V_{53}$ by a change in VH and $V_{gs}$ can be made smaller than the circuit shown in FIG. 25. Although a single diode is connected, a plurality of diodes may be connected. A diode may be connected to the circuits shown in FIGS. 23 to 25.

Eleventh Embodiment

Figure 27:
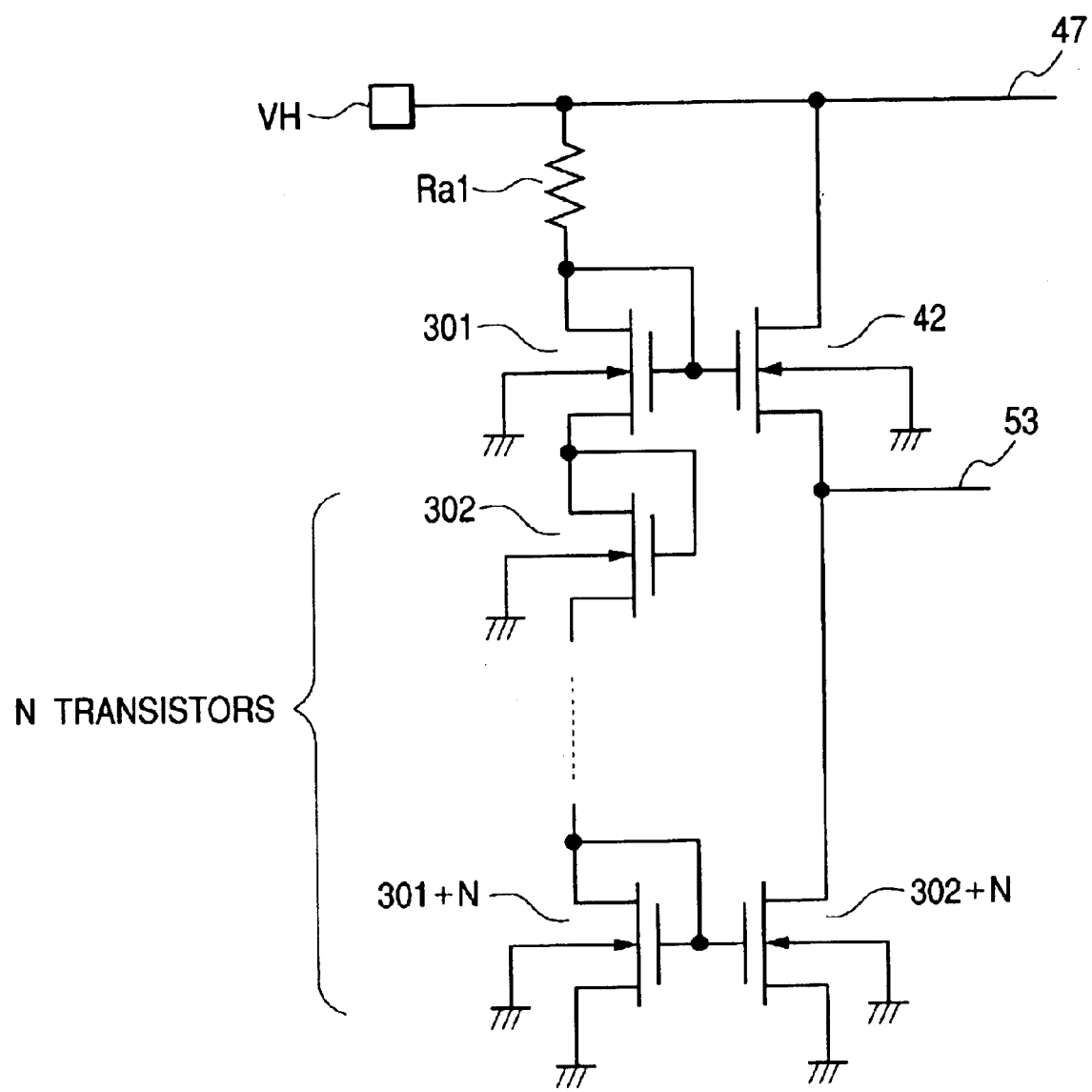
FIG. 27 is a circuit diagram showing another example of the level shift circuit.

FIG. 27 shows the circuit structure of a semiconductor device of the eleventh embodiment. FIG. 27 shows an example of a level shift circuit for generating a proper voltage from the power supply voltage VH. This circuit mitigates the influence of a change in the power supply voltage VH and a change in the gate-source voltage $V_{gs}$ of the transistor upon the output voltage $V_{53}$. The arrangement of a resistor Ra1 and transistors 42 and 302 to (301+N) is similar to that of the circuit shown in FIG. 24. The different point is that the load of the output source follower 42 is changed from the resistor Ra3 to a transistor (302+N) of a current Miller structure whose gate is connected to the gate and drain of the transistor (301+N) In the circuit shown in FIG. 24, by setting $V_{gs}$ of the transistor 42 equal to $V_{gs}$ of the transistor 301, a change in the output voltage $V_{53}$ to be caused by a change in the gate-source voltage of the transistor 42 is cancelled out. However, in this case, it is necessary to set the current value so as to satisfy the following equation:

$$(W/L \text{ of the transistor } \mathbf{42}):(W/L \text{ of the transistor } \mathbf{301})=I_{42}:I_{301} \quad (8)$$

where W is a gate width of the transistor, L is a gate length of the transistor, $I_{42}$ is a drain current of the transistor 42, and $I_{301}$ is a drain current of the transistor 301.

However, in the circuit shown in FIG. 24, the I-V characteristics of the diode-connected transistor are different from the I-V characteristics of the resistor. It is therefore difficult to set the current ratio definite. Even if the current ratio between $I_{42}$ and $I_{301}$ is made definite in the steady state, the current ration between $I_{42}$ and $I_{301}$ changes if VH or the threshold value of the transistor changes. In the circuit shown in FIG. 27, the following equation is satisfied:

$$(W/L \text{ of the transistor } \mathbf{42}):(W/L \text{ of the transistor } \mathbf{301})=I_{42}:I_{301}= (W/L \text{ of the transistor } (\mathbf{301+N})):(W/L \text{ of the transistor } (\mathbf{02+N})) \quad (9)$$

It is therefore easy to set the current ratio between $I_{42}$ and $I_{301}$ by the W/L of the transistors (301+N) and (302+N). Even if VH or the threshold value of the transistor changes, a change in $V_{gs}$ of the transistor 42 can be cancelled out and a stable output voltage can be obtained.

Although this embodiment is applied to the circuit shown in FIG. 24, it may also be applied to the circuits shown in FIGS. 25, 26 and 27.

Liquid Jet Apparatus

A liquid jet apparatus of this embodiment can be manufactured in the following manner. A heat generating resistor made of a heat generating resistor layer is formed on an insulating layer of a semiconductor device of each embodiment described earlier, and the semiconductor device is combined with a jet port forming member such as a top plate made of resin or film in order to form a jet port and a liquid path communicating with the jet port. A container is coupled to this structure and mounted on a printer. When a power supply voltage from a power supply circuit and image data from an image processing circuit are supplied to the printer head, the printer can operate as an ink jet printer.

Figure 17:
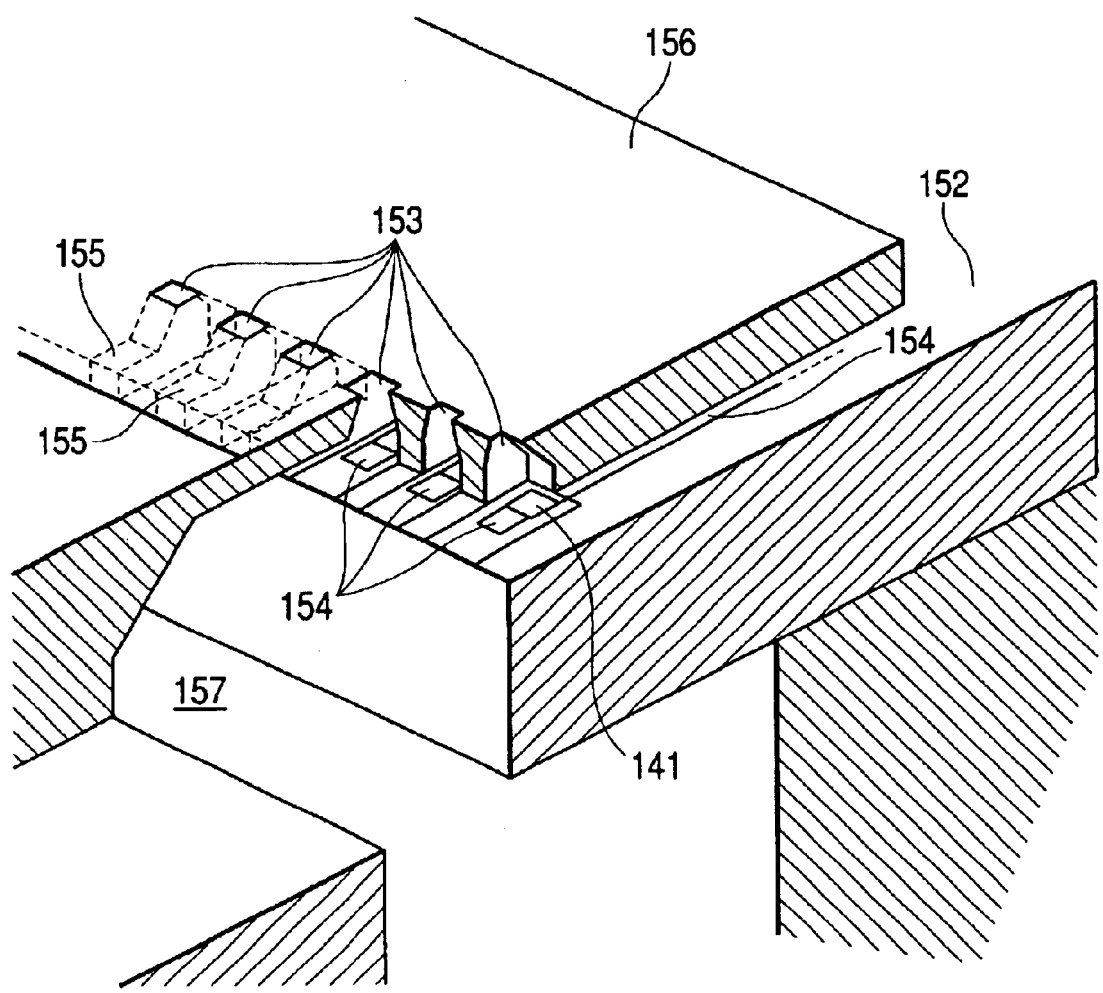
FIG. 17 is a diagram showing a portion of a liquid jet head according to an embodiment of the invention.

FIG. 17 is a perspective view showing a portion of a liquid jet head according to an embodiment.

On an element main base 152 formed with the circuit shown in FIG. 2 or 14, a plurality of electrothermal conversion elements 141 are disposed. Each electrothermal conversion element 141 generates heat upon reception of an electric signal so that bubbles are formed by the heat and ink is jetted out of a jet port 153. Each electrothermal conversion element is connected to a wiring electrode 154 for supplying an electric signal to drive the element. One end of the wiring electrode is electrically connected to the switching element 41 described earlier.

A liquid path 155 is provided for each jet port 153. The liquid path 155 supplies ink to the jet port 153 disposed facing the electrothermal conversion element 141. Walls constituting the jet ports 153 and liquid paths 155 are formed in a grooved member 156. This grooved member 156 is coupled to the element main base 152 for defining the liquid paths 155 and a common liquid container 157 which supplies ink to the liquid paths.

Figure 18:
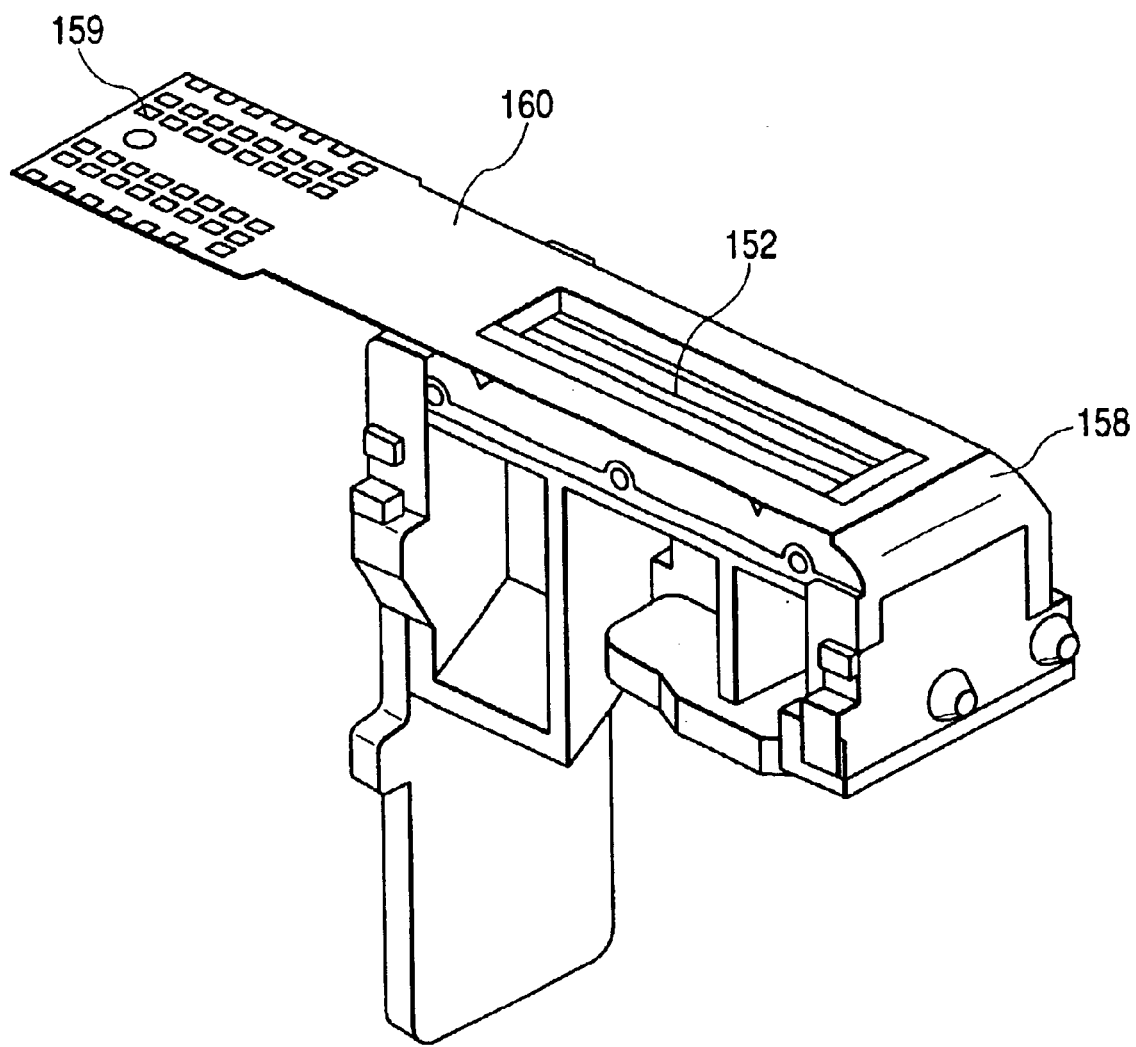
FIG. 18 is a perspective view of the liquid jet head of the embodiment.
Figure 22:
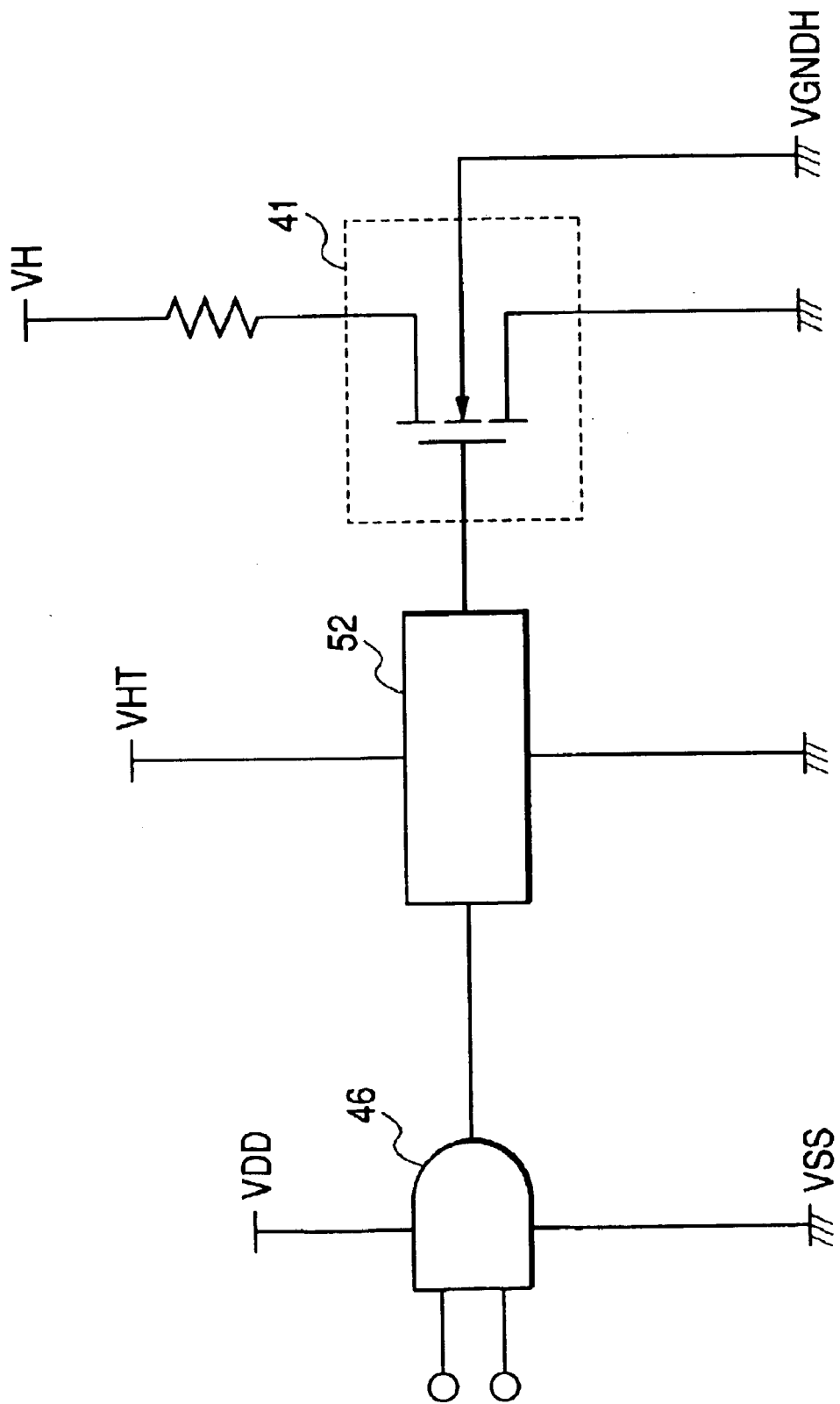
FIG. 22 is a circuit diagram of a circuit for flowing current through a load.

FIG. 18 shows the structure of a liquid jet head assembled with the element main base 152 of the embodiment, the element main base being assembled in a frame 158. On this element main base 152, the grooved member 156 constituting the jet ports 153 and liquid paths 155 is mounted. A contact pad 159 is provided for receiving an electric signal from an apparatus side. An electric signal to be used as a drive signal is supplied from a controller of the apparatus to the element main base 152 via a flexible printed circuit tape 160.

FIG. 19 is a perspective view of an ink jet recording apparatus IJRA using a liquid jet apparatus with a liquid jet head according to an embodiment.

A carriage HC having a pin (not shown) and engaging with a spiral groove 5004 of a reed screw 5005 is reciprocally moved in arrow directions a and b, the reed screw being rotated by drive force transmitting via gears 5011 and 5099 which are rotated in response to a normal or reverse rotation of a drive motor 5013.

Reference numeral 5002 represents a paper push plate for pushing a paper sheet against a platen 5000 used as a recording medium transporting means, along the whole motion length of the carriage. Reference numerals 5007 and 5008 represent a photocoupler used as a home position detecting means for detecting a lever 5006 of the carriage to switch the rotation direction of the motor 5013. Reference numeral 5016 represents a member for supporting a cap member 5022 which caps the front of the recording head, and reference numeral 5015 represents a suction means for sucking the inside of the cap to perform a suction/recovery operation for the recording head via an opening 5023 formed through the wall of the cap. Reference numeral 5017 represents a cleaning blade, and reference numeral 5019 represents a member for moving the blade back and forth, the blade and member being supported by a main support plate 5018. Obviously, the blade may have another structure such as a well-known cleaning blade. Reference numeral 5012 represents a lever for starting suction of suction/recovery. This lever is moved while a cam 5020 engaged with the carriage moves, and controlled by a drive force of the driving motor transmitted by a well-known transmission means such as a clutch.

The capping, cleaning and suction/recovery are performed to effect a desired operation at a desired position in cooperation with the reed screw 5005 when the carriage reaches the home position. A different structure may also be used so long as a desired operation can be performed at known timings. The structures described above are excellent from the singular or collective view point.

This apparatus has a controller drive signal supplying means (not shown) which is constituted of an electronic circuit for supplying the element main base 152 with a power supply voltage, an image signal, a drive control signal and the like.

In each of the embodiments described above, it can be easily understood by a person skilled in the art of semiconductor that the same function can be realized by inverting the conductivity type and potential.

The invention is not limited only to the embodiments described above, but it is obvious that each constituent element of the invention may be replaced with an alternative or equivalent so long as it can solve the problems described earlier.

What is claimed is:

1. A semiconductor device having a switching element for flowing current through a load and a circuit for driving the switching element, respectively formed on a same substrate, wherein:

said circuit comprises a source follower transistor for generating a drive voltage to be applied to a control electrode of said switching element; and a source region of said source follower transistor comprises:

a first doped region connected to a source electrode; and a second doped region having an impurity concentration lower than an impurity concentration of said first doped region, said second doped region forming a pn junction with a semiconductor region forming a channel.

2. A semiconductor device according to claim 1, wherein:

said switching element is a DMOS transistor, said DMOS transistor comprising: a low impurity concentration drain region made of semiconductor of a second conductivity type and formed in a principal surface of a semiconductor substrate of a first conductivity type; a semiconductor region of the first conductivity type formed in the low impurity concentration drain region; a gate electrode as the control electrode formed via an insulating film on a surface where the pn junction between the semiconductor region and the low impurity concentration drain region; a source region of the second conductivity type formed on one end side of the gate electrode; and a drain region of the second conductivity type formed in the low impurity concentration drain region and having an impurity concentration higher than an impurity concentration of the low impurity concentration drain region; and said source follower transistor is an insulated gate type transistor having characteristics different from the DMOS transistor.

3. A semiconductor device according to claim 1, wherein a drain of said source follower transistor comprises a first doped region connected to a drain electrode and a second doped region having an impurity concentration lower than an impurity concentration of said first doped region, said second doped region forming a pn junction with the semiconductor region forming the channel.

4. A semiconductor device according to claim 1, wherein the drive voltage generated by said source follower transistor is applied to the control electrode via a CMOS circuit.

5. A semiconductor device according to claim 2, wherein said second doped region of said source follower transistor is shallower than a depth of the low impurity concentration drain region.

6. A semiconductor device according to claim 2, wherein said second doped region of said source follower transistor has a depth same as a depth of the low impurity concentration drain region.

7. A semiconductor device according to claim 2, wherein the semiconductor region is formed deeper than the low impurity concentration drain region.

8. A semiconductor device according to claim 7, wherein a plurality of DMOS transistors are disposed in an array without involving a dedicated element separation region.

9. A semiconductor device according to claim 2, wherein said circuit comprises a low voltage CMOS circuit and a high voltage CMOS circuit to be controlled by the low voltage CMOS circuit, and a MOS transistor of the first conductivity type constituting the high voltage CMOS circuit is a DMOS transistor.

10. A semiconductor device according to claim 9, wherein a MOS transistor of the second conductivity type constituting the high voltage CMOS circuit comprises a low impurity concentration drain region and a high impurity concentration drain region having an impurity concentration higher than an impurity concentration of the first low impurity concentration region, respectively formed in a well region of the second conductivity type.

11. A semiconductor device according to claim 1, wherein said circuit comprises:

a low voltage CMOS circuit;

a high voltage CMOS circuit to be controlled by the low voltage CMOS circuit, the high voltage CMOS circuit applying the drive voltage to the control electrode of said switching element; and a voltage converting circuit for receiving a low voltage signal from the low voltage CMOS circuit and outputting a high voltage signal to the high voltage CMOS circuit.

12. A semiconductor device according to claim 11, wherein the voltage converting circuit comprises a CMOS inverter and a MOS switch, the MOS switch being connected to a source of one MOS transistor constituting the CMOS inverter and turned on and off synchronously with the one MOS transistor.

13. A semiconductor device according to claim 11, wherein the voltage converting circuit includes a CMOS inverter having a MOS transistor of one conductivity type with a plurality of gate electrodes to which a same phase signal is applied.

14. A semiconductor device according to claim 1, wherein an electrothermal conversion body serving as the load is integrated with and connected to a drain of said switching element.

15. A semiconductor device according to claim 2, wherein the characteristics are at least one selected from a group consisting of a threshold value, a breakdown voltage, and a substrate current.

16. A liquid jet apparatus for jetting out liquid by utilizing heat generated by an electrothermal conversion body, comprising:

a semiconductor device recited in claim 1; and a jet port provided in correspondence with the electrothermal conversion body serving as the load.

17. A liquid jet apparatus according to claim 16, further comprising a container for accommodating liquid to be supplied to the electrothermal conversion body.

18. A liquid jet apparatus for jetting out liquid by utilizing heat generated by an electrothermal conversion body, comprising:

a semiconductor device recited in claim 1;

a jet port provided in correspondence with the electrothermal conversion body serving as the load;

a container for accommodating liquid to be supplied to the electrothermal conversion body; and a power supply circuit for supplying a power supply voltage to said semiconductor device.

* * * * *

UNITED STATES PATENT AND TRADEMARK OFFICE
CERTIFICATE OF CORRECTION

| | |
|---|---|
| PATENT NO. | : 6,822,289 B2 |
| APPLICATION NO. | : 10/368579 |
| DATED | : November 23, 2004 |
| INVENTOR(S) | : Hiraku Kozuka et al. |

Page 1 of 1

It is certified that error appears in the above-identified patent and that said Letters Patent is hereby corrected as shown below:

COLUMN 9

Line 15, "that" should read --that in which--.

COLUMN 16

Line 31, "Inverter" should read --inverter--.

COLUMN 20

Line 22, "(301+N)" should read --(301+N).--; and
Line 44, "(02+N)()9)" should read --(02+N)   (9)--.

COLUMN 22

Line 40, "between" should read --is between--.

Signed and Sealed this

Eighth Day of April, 2008

JON W. DUDAS
*Director of the United States Patent and Trademark Office*